United States Patent
Wu et al.

(10) Patent No.: US 11,430,890 B2
(45) Date of Patent: Aug. 30, 2022

(54) INTEGRATED CIRCUITS WITH CHANNEL-STRAIN LINER

(71) Applicant: Taiwan Semiconductor Manufacturing Co., Ltd., Hsinchu (TW)

(72) Inventors: Xusheng Wu, Hsinchu (TW); Chang-Miao Liu, Hsinchu (TW); Huiling Shang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/099,142

(22) Filed: Nov. 16, 2020

(65) Prior Publication Data

US 2021/0083113 A1 Mar. 18, 2021

Related U.S. Application Data

(62) Division of application No. 16/192,856, filed on Nov. 16, 2018, now Pat. No. 10,840,375.

(Continued)

(51) Int. Cl.
*H01L 29/78* (2006.01)
*H01L 27/092* (2006.01)
(Continued)

(52) U.S. Cl.
CPC .... *H01L 29/7843* (2013.01); *H01L 21/02164* (2013.01); *H01L 21/02238* (2013.01); *H01L 21/2255* (2013.01); *H01L 21/823807* (2013.01); *H01L 21/823821* (2013.01); *H01L 27/0924* (2013.01); *H01L 29/66795* (2013.01); *H01L 29/785* (2013.01); *H01L 21/31116* (2013.01);
(Continued)

(58) Field of Classification Search
CPC .......... H01L 29/7843; H01L 21/02164; H01L 21/02238; H01L 21/2255; H01L 21/823807; H01L 21/823821; H01L 27/0924; H01L 29/66795; H01L 29/785; H01L 21/76897; H01L 29/6656; H01L 21/0223; H01L 21/02255; H01L 21/02282; H01L 21/76828; H01L 21/76829; H01L 29/7848; H01L 29/66545; H01L 21/823814; H01L 27/092; H01L 29/42356; H01L 29/66803; H01L 21/31116; H01L 23/53295
See application file for complete search history.

(56) References Cited

U.S. PATENT DOCUMENTS 8,836,016 B2  9/2014  Wu et al.
8,841,701 B2  9/2014  Lin et al.
(Continued)

*Primary Examiner* — Patricia D Valenzuela
(74) *Attorney, Agent, or Firm* — Haynes and Boone, LLP

(57) ABSTRACT

Examples of an integrated circuit with a strain-generating liner and a method for forming the integrated circuit are provided herein. In some examples, an integrated circuit device includes a substrate, a fin extending from the substrate, and a gate disposed on the fin. The gate has a bottom portion disposed towards the fin and a top portion disposed on the bottom portion. A liner is disposed on a side surface of the bottom portion of the gate such that the top portion of the gate is free of the liner. In some such examples, the liner is configured to produce a channel strain.

20 Claims, 14 Drawing Sheets

Related U.S. Application Data

(60) Provisional application No. 62/691,668, filed on Jun. 29, 2018.

(51) Int. Cl.
| | |
|---|---|
| *H01L 29/66* | (2006.01) |
| *H01L 21/8238* | (2006.01) |
| *H01L 21/225* | (2006.01) |
| *H01L 21/02* | (2006.01) |
| H01L 21/768 | (2006.01) |
| H01L 23/532 | (2006.01) |
| H01L 21/311 | (2006.01) |

(52) U.S. Cl.
CPC .. *H01L 21/76897* (2013.01); *H01L 23/53295* (2013.01); *H01L 29/6656* (2013.01)

(56) References Cited

U.S. PATENT DOCUMENTS

| | | |
|---|---|---|
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 * | 12/2016 | Chang ............. H01L 21/823437 |
| 9,576,814 B2 | 2/2017 | Wu et al. |
| 2019/0164898 A1 * | 5/2019 | Zang ................ H01L 21/76895 |
| 2020/0006558 A1 | 1/2020 | Wu et al. |

* cited by examiner

INTEGRATED CIRCUITS WITH CHANNEL-STRAIN LINER

PRIORITY DATA

The present application is a divisional application of U.S. application Ser. No. 16/192,856, filed Nov. 16, 2018, which claims the benefit of U.S. Provisional Application No. 62/691,668, entitled "Integrated Circuits with Channel-Strain Liner," filed Jun. 29, 2018, each of which is herein incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs. Parallel advances in manufacturing have allowed increasingly complex designs to be fabricated with precision and reliability.

For example, advances in fabrication have enabled three-dimensional designs, such as a fin-like field effect transistor (FinFET). A FinFET may be envisioned as a typical planar device extruded out of a substrate and into the gate. An exemplary FinFET is fabricated with a thin "fin" (or fin structure) extending up from a substrate. The channel region of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of way, and in some applications, FinFETs provide reduced short channel effects, reduced leakage, and higher current flow. In other words, they may be faster, smaller, and more efficient than planar devices.

Both FinFETs and planar devices may benefit from fabrication optimizations such as strain engineering where strain-generating layers are formed to apply stress to portions of the devices and thereby improve the flow of charge carriers through the channel regions of the devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
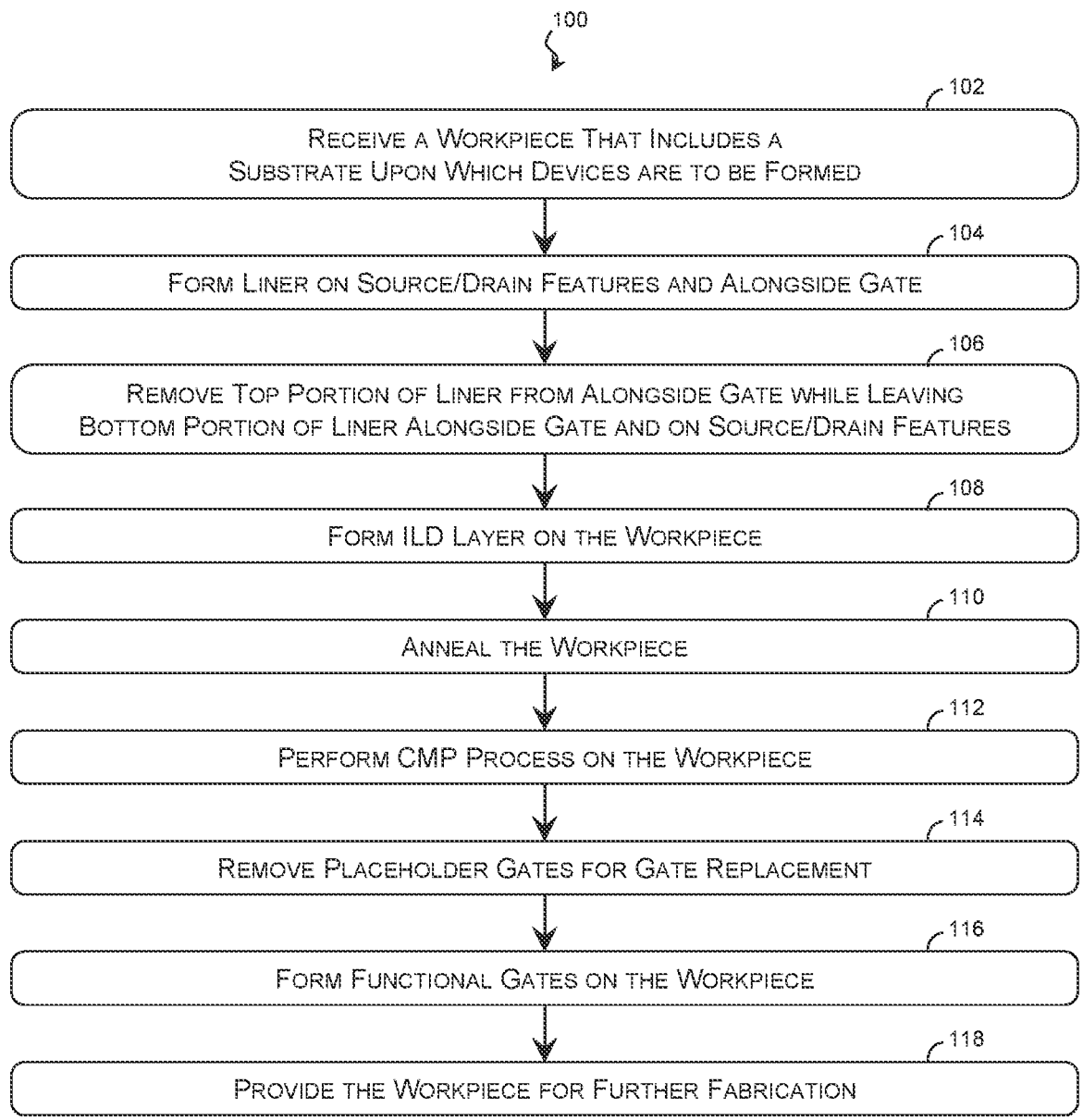
FIG. 1 is a flow diagram of a method of fabricating a workpiece with a strain-generating liner according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature connected to and/or coupled to another feature in the present disclosure that follows may include embodiments in which the features are formed in direct contact, and may also include embodiments in which additional features may be formed interposing the features, such that the features may not be in direct contact.

In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. In addition, the present disclosure may repeat reference numerals and/or letters in the various examples. This repetition is for the purpose of simplicity and clarity and does not in itself dictate a relationship between the various embodiments and/or configurations beyond the extent noted.

An exemplary integrated circuit includes a number of electrically interconnected planar devices (e.g., Field Effect Transistors (FETs)) and/or non-planar devices (e.g., Fin-like FETs (FinFETs)). One or more strain-generating layers may be formed on some of the devices. In one such example, a strain-generating layer is formed on source/drain features of planar and/or non-planar devices. The strain-generating layer may also extend vertically alongside gates of the devices. When the strain-generating layer is oxidized, it expands and creates a strain on the adjacent channel regions.

However, it has been determined that the uppermost portions of the strain-generating layer extending alongside the gates may not meaningfully contribute to the channel strain because they are some distance away from the substrate and the channel. Instead, these portions of the layer apply force to the gates themselves and the surrounding structures. During a gate replacement process where a placeholder gate is removed, the top of the strain-generating layer may press inward on a recess left by the placeholder gate and may cause the top of the recess to narrow or collapse. Even if the recess does not collapse, the narrowing may cause fill problems when forming a functional gate in the recess. Moreover, when the functional gate is formed in the recess, the gate may have a narrower top and a reduced critical dimension. The narrow-top gates may create contact alignment issues and may have increased gate resistance. Accordingly, some examples of the present technique selectively remove the uppermost portions of the strain-generating layer from alongside the device gates.

In these ways and others, the modified strain-generating layer provides improved electrical performance (e.g., reduced resistance in the on-mode, greater current, faster switching, etc.) without the risk of gate deformation, reduced critical dimension, or fill defects associated with some techniques. However, unless otherwise noted, no embodiment is required to provide any particular advantage.

The present disclosure provides examples of integrated circuit devices and techniques for fabricating the devices. Some examples form non-planar transistors, such as those described with reference to FIG. 1 and FIGS. 2A-11B. Further examples form planar transistors, such as those described with reference to FIG. 1 and FIGS. 12A-14B.

FIG. 1 is a flow diagram of a method 100 of fabricating a workpiece with a strain-generating liner according to various aspects of the present disclosure. Additional steps can be provided before, during, and after the method 100, and some of the steps described can be replaced or eliminated for other embodiments of the method 100.

FIGS. 2A, 3A, 4A, 5A, 6A, 7A, 8A, 9A, 10A, and 11A are cross-sectional diagrams of a first region of a workpiece 200 for forming non-planar devices at various points in the method of fabrication according to various aspects of the present disclosure. FIGS. 2B, 3B, 4B, 5B, 6B, 7B, 8B, 9B, 10B, and 11B are cross-sectional diagrams of a second region of the workpiece 200 for forming non-planar devices at various points in the method of fabrication according to various aspects of the present disclosure. FIGS. 2A-11B have been simplified for the sake of clarity and to better illustrate the concepts of the present disclosure. Additional features may be incorporated into the workpiece 200, and some of the features described below may be replaced or eliminated for other embodiments of the workpiece 200.

Figure 2A:
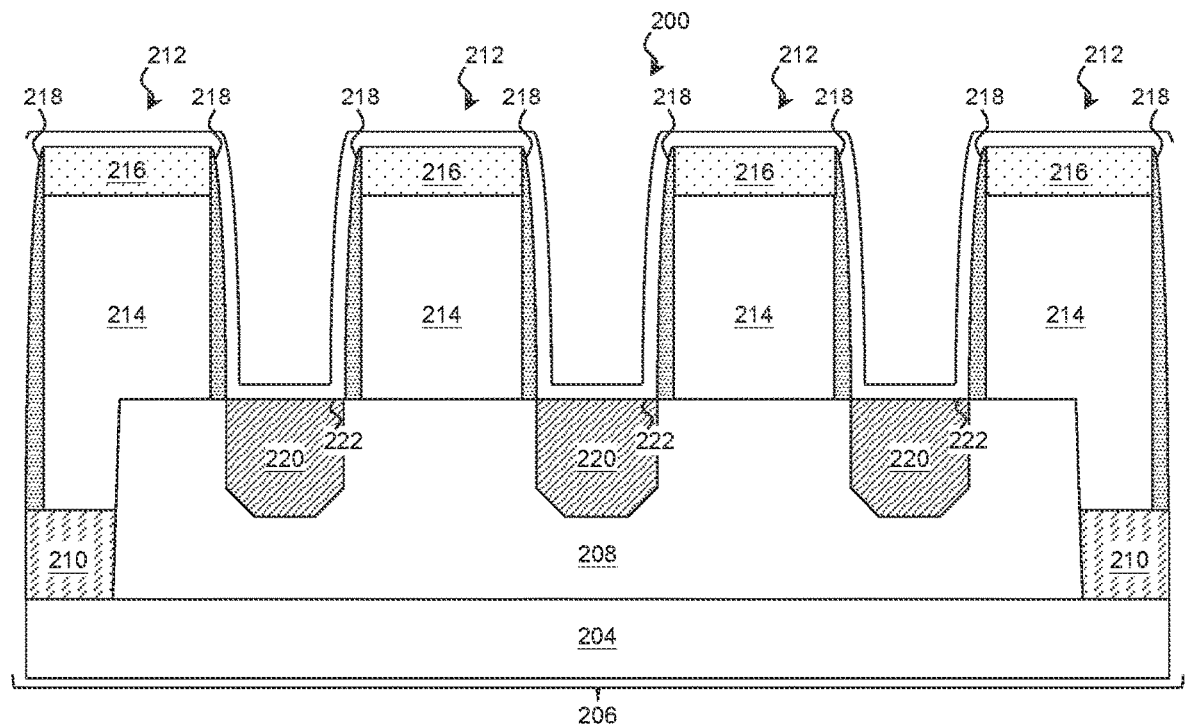
FIGS. 2A, 3A, 4A, 5A, 6A, 7A, 8A, 9A, 10A, and 11A are cross-sectional diagrams of a first region of a workpiece for forming non-planar devices at various points in the method of fabrication according to various aspects of the present disclosure.
Figure 2B:
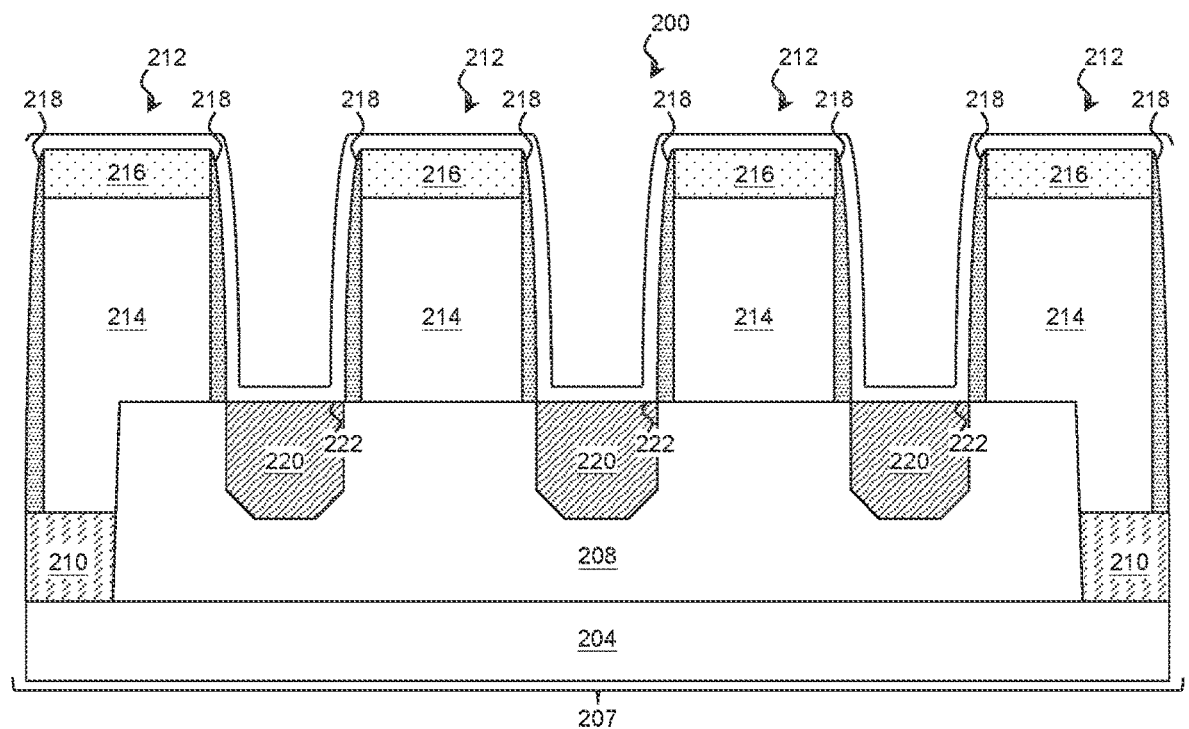
FIGS. 2B, 3B, 4B, 5B, 6B, 7B, 8B, 9B, 10B, and 11B are cross-sectional diagrams of a second region of the workpiece for forming non-planar devices at various points in the method of fabrication according to various aspects of the present disclosure.

Referring to block 102 of FIG. 1 and to FIGS. 2A and 2B, the workpiece 200 is received. The workpiece 200 includes a substrate 204 upon which devices are to be formed. In various examples, the substrate 204 includes an elementary (single element) semiconductor, such as silicon or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 204 may be uniform in composition or may include various layers, some of which may be selectively etched to form the fins. The layers may have similar or different compositions, and in various embodiments, some substrate layers have non-uniform compositions to induce device strain and thereby tune device performance. Examples of layered substrates also include silicon-on-insulator (SOI) substrates 204. In some such examples, an insulator layer of an SOI substrate 204 includes a semiconductor oxide, a semiconductor nitride, a semiconductor oxynitride, a semiconductor carbide, and/or other suitable insulator materials.

Doped regions, such as wells, may be formed on the substrate 204, and some regions of the substrate 204 may be doped with p-type dopants, such as boron, $BF_2$, or indium while other regions of the substrate 204 may be doped with n-type dopants, such as phosphorus or arsenic; and/or other suitable dopants including combinations thereof. The doping of a particular region of the substrate 204 may depend on the devices to be formed on the region. In an example, the substrate 204 includes a first region 206 for forming p-channel devices illustrated in FIGS. 2A, 3A, 4A, 5A, 6A, 7A, 8A, 9A, 10A, and 11A and a second region 207 for forming n-channel devices illustrated in FIGS. 2B, 3B, 4B, 5B, 6B, 7B, 8B, 9B, 10B, and 11B.

In some examples, the devices to be formed on the substrate 204 extend out of the substrate 204. For example, FinFETs and/or other non-planar devices may be formed on device fins 208 disposed on the substrate 204. The device fins 208 are representative of any raised feature and include FinFET device fins 208 as well as fins 208 for forming other raised active and passive devices upon the substrate 204. The fins 208 may be formed by etching portions of the substrate 204, by depositing various layers on the substrate 204 and etching the layers, and/or by other suitable techniques. For example, the fins 208 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The fins 208 may be similar in composition to the substrate 204 or may be different therefrom. For example, in some embodiments, the substrate 204 includes primarily silicon, while the fins 208 include one or more layers that are primarily germanium or a SiGe semiconductor. In some embodiments, the substrate 204 includes a SiGe semiconductor, and the fins 208 include one or more layers that include a SiGe semiconductor with a different ratio of silicon to germanium.

The fins 208 may be physically and electrically separated from each other by isolation features 210, such as a shallow trench isolation features (STIs). In that regard, the fins 208 extend from the substrate 204 through the isolation features 210 and extend above the isolation features 210 so that a gate structure (e.g., placeholder gate 212) may wrap around the fins 208. In various examples, the isolation features 210 include dielectric materials such as semiconductor oxides, semiconductor nitrides, semiconductor carbides, FluoroSilicate Glass (FSG), low-K dielectric materials, and/or other suitable dielectric materials.

Placeholder or dummy gates 212 are formed over channel regions of the fins 208. The flow of carriers (electrons for an n-channel FinFET and holes for a p-channel FinFET) between source/drain features through a channel region is controlled by a voltage applied to a gate structure that is adjacent to and overwrapping the channel region. When materials of the gate structure are sensitive to some fabrication processes, such as source/drain activation annealing, or are difficult to pattern, a placeholder gate 212 may be used during some of the fabrication processes and subsequently removed and replaced with elements of a functional gate (e.g., a gate electrode, a gate dielectric layer, an interfacial layer, etc.) in a gate-last process.

In an example, forming the placeholder gates 212 includes depositing a layer of placeholder gate material 214, such as polysilicon, a dielectric material (e.g., a semiconductor oxide, a semiconductor nitride, a semiconductor oxynitride, a semiconductor carbide, a semiconductor oxycarbonitride, etc.), and/or other suitable material.

A hard mask layer 216 may be deposited on the layer of placeholder gate material 214. The hard mask layer 216 may be different in composition than the placeholder gate material 214, and in various examples, the hard mask layer 216 includes a dielectric material (e.g., a semiconductor oxide, a semiconductor nitride, a semiconductor oxynitride, a semiconductor carbide, a semiconductor oxycarbonitride, etc.), and/or other suitable material. In some embodiments, the hard mask layer 216 includes a plurality of constituent layers each with a different dielectric material, and in one such embodiment, the hard mask layer 216 includes a first layer of a semiconductor oxide disposed on the placeholder gate material 214 and a second layer of a semiconductor nitride disposed on the layer of oxide.

The placeholder gate material 214 and the hard mask layer 216 may be formed as uniform layers and patterned using an etching process—such as wet etching, dry etching, Reactive Ion Etching (RIE), ashing, and/or other etching methods—to define the placeholder gates 212.

Sidewall spacers 218 are formed on side surfaces of the placeholder gates 212. In various examples, the sidewall spacers 218 include one or more layers of suitable materials, such as a dielectric material (e.g., a semiconductor oxide, a semiconductor nitride, a semiconductor oxynitride, a semiconductor carbide, a semiconductor oxycarbonitride, etc.), Spin On Glass (SOG), tetraethylorthosilicate (TEOS), Plasma Enhanced CVD oxide (PE-oxide), High-Aspect-Ratio-Process (HARP)-formed oxide, and/or other suitable material. In some examples, the sidewall spacers 218 includes one or more layers of a low-k dielectric material such as PhosphoSilicate Glass (PSG), BoroPhosphoSilicate Glass (BPSG), Fluorinated Silica Glass (FSG), carbon doped silicon oxide, Black Diamond®, Xerogel, Aerogel, amorphous fluorinated carbon, Parylene, BCB (bis-benzocyclobutenes), SiLK® (a registered trademark of Dow Chemical, Midland, Mich.), polyimide, other suitable materials. In one embodiment, the sidewall spacers 218 each include a first layer of a semiconductor oxide, a second layer of a semiconductor nitride disposed on the first layer, and a third layer of a semiconductor oxide disposed on the second layer. In the embodiment, each layer of the sidewall spacers 218 has a thickness between about 1 nm and about 50 nm.

Source/drain features 220 are formed on the fins 208 on opposing sides of the placeholder gates 212. In various examples the source/drain features 220 are formed by a Chemical Vapor Deposition (CVD) deposition technique (e.g., Vapor-Phase Epitaxy (VPE) and/or Ultra-High Vacuum CVD (UHV-CVD)), molecular beam epitaxy, and/or other suitable processes. The epitaxy process may use gaseous and/or liquid precursors, which interact with a component of the substrate 204 (e.g., silicon or silicon-germanium) to form the source/drain features 220. The semiconductor component of the source/drain features 220 may be similar to or different from the remainder of the fin 208. For example, Si-containing source/drain features 220 may be formed on a SiGe-containing fin 208 or vice versa. When the source/drain features 220 and fins 208 contain more than one semiconductor, the ratios may be substantially similar or different.

The source/drain features 220 may be in-situ doped to include p-type dopants, such as boron, $BF_2$, or indium; n-type dopants, such as phosphorus or arsenic; and/or other suitable dopants including combinations thereof. Additionally or in the alternative, the source/drain features 220 may be doped using an implantation process (i.e., a junction implant process) after the source/drain features 220 are formed. With respect to the particular dopant type, the source/drain features 220 are doped to be of opposite type than the remainder of the fins 208. For a p-channel device, the fin 208 is doped with an n-type dopant and the source/drain features 220 are doped with a p-type dopant, and vice versa for an n-channel device. Once the dopant(s) are introduced into the source/drain features 220, a dopant activation process, such as Rapid Thermal Annealing (RTA) and/or a laser annealing process, may be performed to activate the dopants.

A contact-etch stop layer (CESL) 222 may be formed on the source/drain features 220 and along the top and sides of the placeholder gates 212. The CESL 222 may include a dielectric (e.g., a semiconductor oxide, a semiconductor nitride, a semiconductor oxynitride, a semiconductor carbide, etc.) and/or other suitable material, and in various embodiments, the CESL 222 includes SiN, SiO, SiON, and/or SiC. The CESL 222 may be deposited by any suitable technique including Atomic Layer Deposition (ALD), CVD, High Density Plasma CVD (HDP-CVD), and/or other suitable techniques and may be formed to any suitable thickness. In some examples, the CESL 222 has a thickness between about 1 nm and about 50 nm.

Figure 3A:
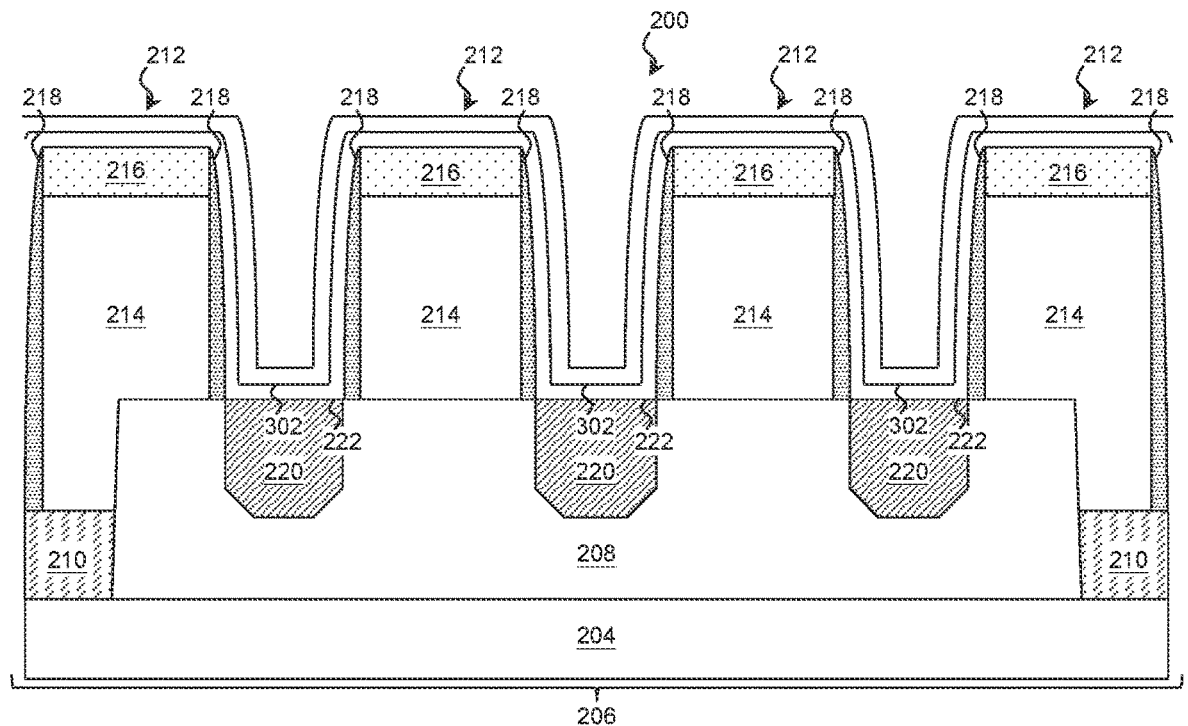
Figure 3B:
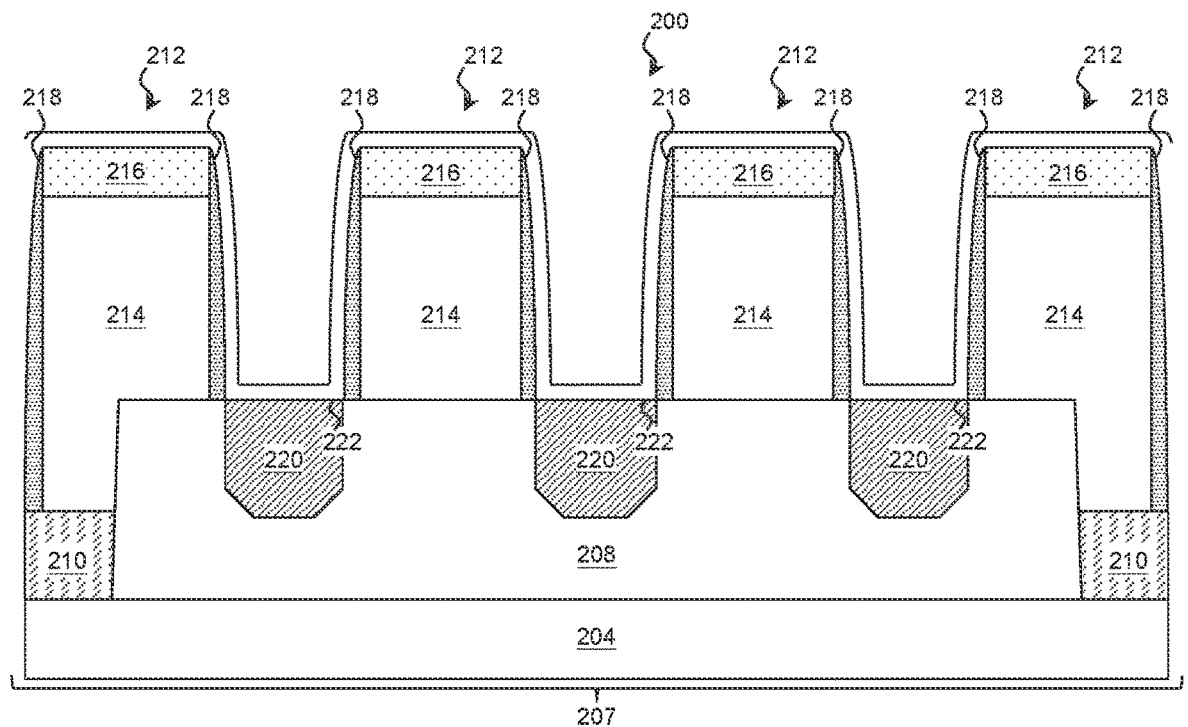

Referring to block 104 of FIG. 1 and to FIGS. 3A and 3B, a liner 302 is formed on the CESL 222 so that the liner 302 is disposed over the source/drain features 220 and extends vertically along the side surfaces of the placeholder gates 212. The liner 302 may also be disposed over the top surfaces of the placeholder gates 212. The liner 302 may include a semiconductor (e.g., Si, Ge, SiGe, etc.), a dielectric (e.g., a semiconductor oxide, a semiconductor nitride, a semiconductor oxynitride, a semiconductor carbide, etc.), and/or other suitable material. A semiconductor-containing liner 302 may also contain one or more dopants (e.g., B, $BF_2$, In, P, and/or As). The liner 302 may be deposited by any suitable technique including ALD, CVD, HDP-CVD, and/or other suitable techniques and may be formed to any suitable thickness. The particular thickness may be selected so that the liner 302 is thick enough to create channel stress when the liner is oxidized while being thin enough to oxidize fully within a given annealing budget. In some examples, the liner 302 has a thickness between about 1 nm and about 10 nm.

The liner 302 may be used to impart a strain on the channel regions of the devices to be formed on the fin 208. In many applications, channel strain improves carrier mobility and thereby enhances electrical performance (e.g., reduces $R_{on}$, increases efficiency, increases switching speed, etc.) of a transistor. Different orientations of strain produce different effects on different types of devices. In general, compressive strain on the channel region typically improves the carrier mobility of p-channel devices, while tensile strain improves the carrier mobility of n-channel devices. Accordingly, in some embodiments, the liner 302 is configured to improve the carrier mobility of the p-channel devices and is correspondingly disposed on the first region 206 for forming p-channel devices without being disposed on a second region 207 for forming n-channel devices.

In some embodiments, this is achieved by first forming the liner 302 on both regions of the substrate 204. Then, a photoresist layer is applied to the workpiece and patterned to cover and protect the liner 302 in the first region 206 and to expose the liner 302 in the second region 207. An exemplary photoresist layer includes a photosensitive material that causes the layer to undergo a property change when exposed to light. This property change can be used to selectively remove exposed or unexposed portions of the photoresist layer in a process referred to as lithographic patterning.

For example, in one such embodiment, a photolithographic system exposes the photoresist layer to radiation in a particular pattern determined by a mask. Light passing through or reflecting off the mask strikes the photoresist layer thereby transferring a pattern formed on the mask to the photoresist. In other such embodiments, the photoresist layer is patterned using a direct write or maskless lithographic technique such as laser patterning, e-beam patterning, and/or ion-beam patterning. Once exposed, the photoresist layer is developed leaving only the exposed portions of the resist, or in alternate embodiments, leaving only the unexposed portions of the resist. An exemplary patterning process includes soft baking of the photoresist layer, mask aligning, exposure, post-exposure baking, developing the photoresist layer, rinsing, and drying (e.g., hard baking).

The patterning process removes those portions of the photoresist layer that are in the second region 207. Accordingly, after patterning the photoresist layer, one or more etching processes may be performed on the workpiece 200 to remove the liner 302 from the second region 207 while the photoresist layer protects the liner 302 in the first region 206. The etching processes may include any suitable etching technique such as dry etching, wet etching, and/or other etching methods (e.g., reactive ion etching (RIE)). The etching technique including the etchant chemistry may be configured to avoid significant etching of the photoresist layer and/or the CESL 222. Any remaining photoresist may be removed after the etching of the liner 302.

Referring to block 106 of FIG. 1, the liner 302 is partially removed from alongside the placeholder gates 212. In particular, a top portion of the liner 302 is removed from along the side surfaces of the placeholder gates 212 while a bottom portion of the liner 302 remains along the side the placeholder gates 212 and on the source/drain features 220. Any suitable chamfering process may be used to remove the top portion of the liner 302.

Figure 4A:
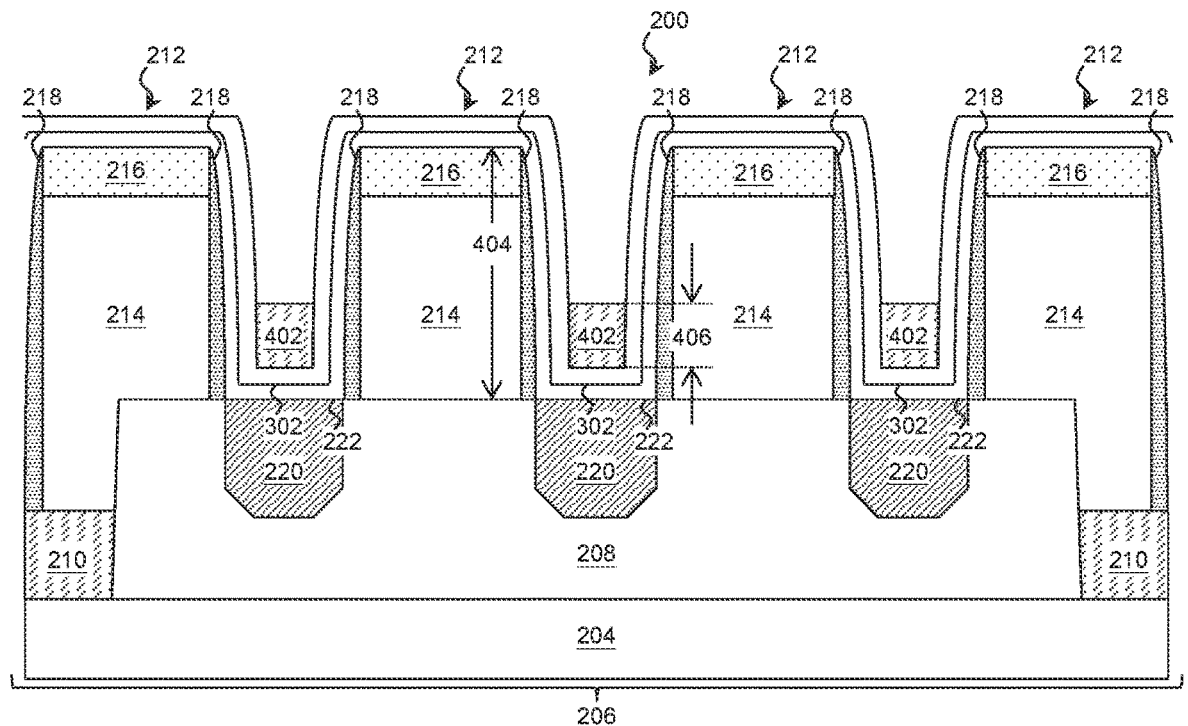
Figure 4B:
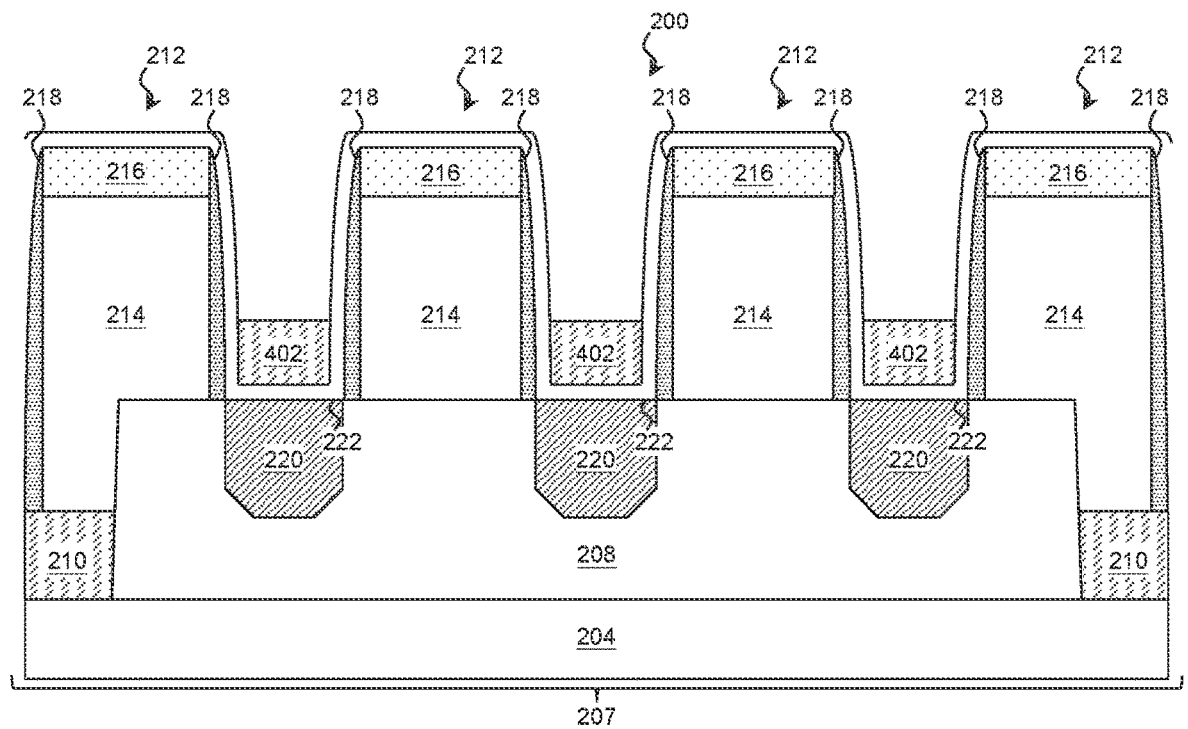

In some examples, a set of chamfering features 402 are formed on the workpiece 200 as illustrated in FIGS. 4A and 4B. The chamfering features 402 are disposed between the placeholder gates 212 and protect underlying portions of the liner 302 during a subsequent etching process. The chamfering features 402 include any suitable material, which may be selected to have a different etch selectivity than the liner 302 and/or the CESL 222. In various examples, the chamfering features 402 include a dielectric (e.g., a semiconductor oxide, a semiconductor nitride, a semiconductor oxynitride, a semiconductor carbide, a semiconductor carboxynitride, etc.), polysilicon, SOG, TEOS, PE-oxide, HARP-formed oxide, Bottom Anti-Reflective Coating (BARC), and/or other suitable materials. The chamfering features 402 may be deposited using any suitable process including ALD, CVD, HDP-CVD, PVD, spin-on deposition, and/or other suitable deposition processes.

The chamfering features 402 may be formed by depositing the selected material(s) on top of the source/drain features 220 and on top of the placeholder gates 212 etching back the liner from the top of placeholder gates 212. The etched back chamfering features 402 expose part of the liner 302 that is disposed that alongside the placeholder gates 212.

In various examples, the chamfering feature 402 is etched back using wet etching, dry etching, RIE, and/or Chemical Mechanical Planarization/Polishing (CMP). The remaining portion of the chamfering feature 402 may have any suitable height and/or aspect ratio. In various examples, a chamfering feature 402 has a height that is between about $\frac{1}{100}$ and about $\frac{4}{5}$ the height of the adjacent placeholder gate 212 as indicated by markers 404 and 406.

Figure 5A:
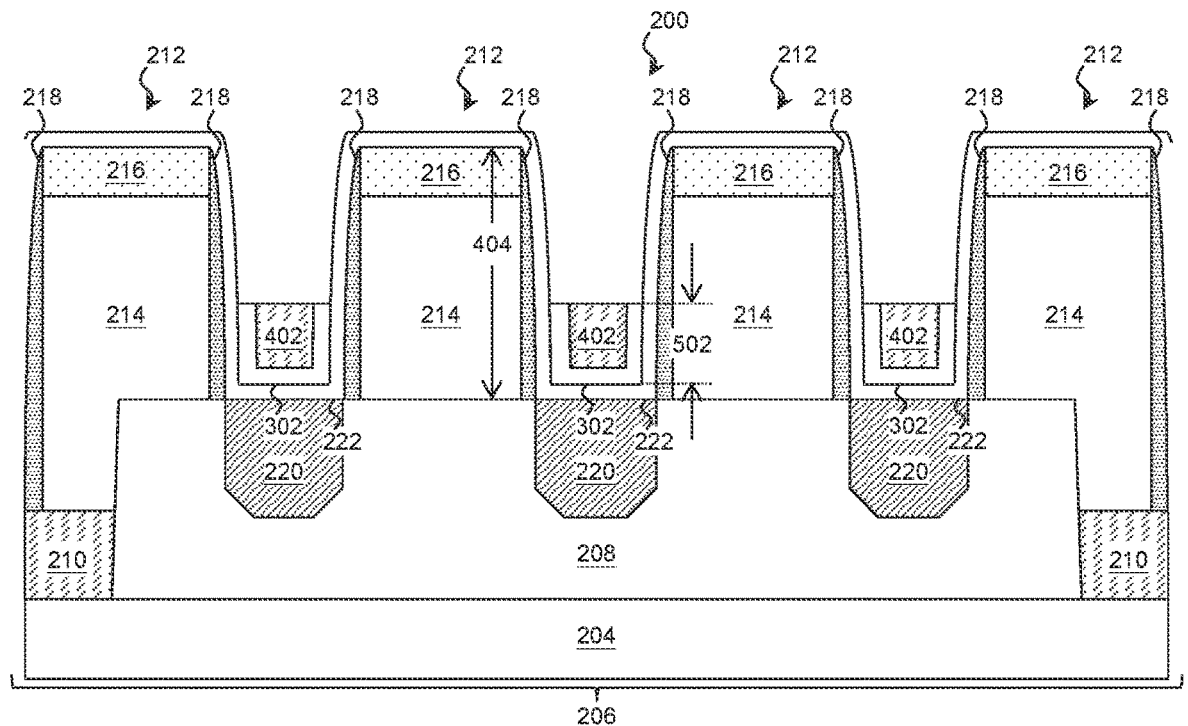
Figure 5B:
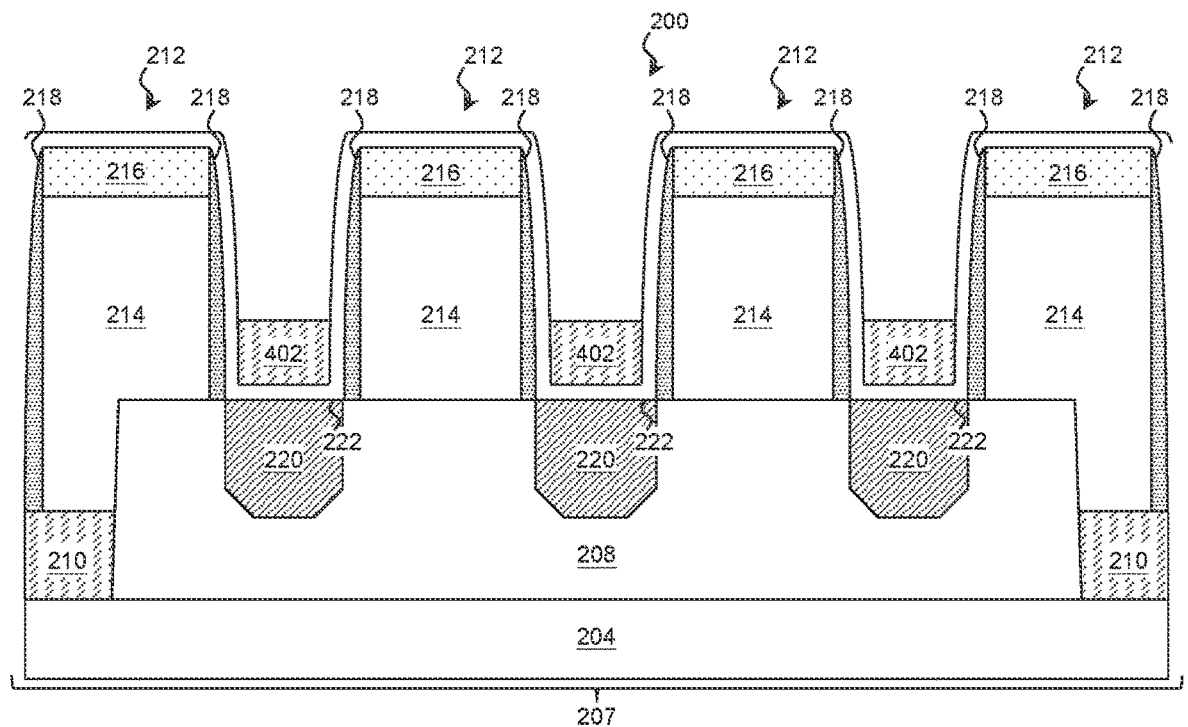

Thereafter, the exposed portions of the liner 302 are etched as illustrated in FIGS. 5A and 5B. Between the placeholder gates 212, the etching removes at least a portion of the liner 302 disposed alongside the sidewall spacers 218 and extending along the vertical surfaces of the CESL 222. The remaining portion of the liner 302 may include a horizontal portion extending along the source/drain features 220 and vertical portions extending along the vertical surfaces of the CESL 222 to a height above the horizontal portion. In that regard, the vertical portions may have any suitable height 502. In various examples, the height 404 of the placeholder gates 212 is between about 10 nm and about 500 nm, and the height 502 of the vertical portions of the liner 302 is between about $\frac{1}{100}$ and about $\frac{4}{5}$ the height 404 of the placeholder gate 212. Thus, the majority of the placeholder gates 212 (and the majority of the sidewall spacers 218 and of the vertical surfaces of the CESL 222) may be free of the liner 302.

In various examples, the etching of the liner 302 includes wet etching, dry etching, RIE, and/or other suitable etching processes. The etching process and etchant chemistry may be selected to avoid significant etching of the CESL 222, the chamfering features 402, and the portions of the liner 302 below and alongside the chamfering features 402. For example, when utilizing wet etching, a viscosity of the etchant may be selected to prevent significant etching of the portion of the liner 302 disposed alongside a chamfering feature 402 despite being otherwise exposed.

Figure 6A:
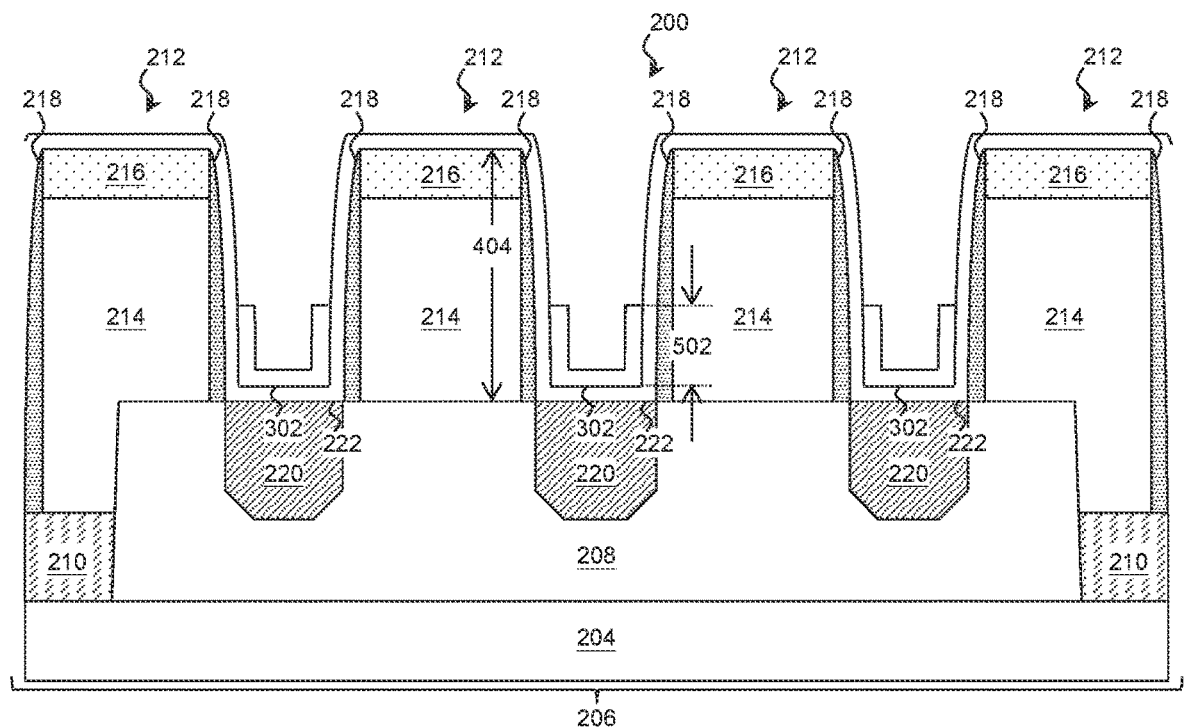
Figure 6B:
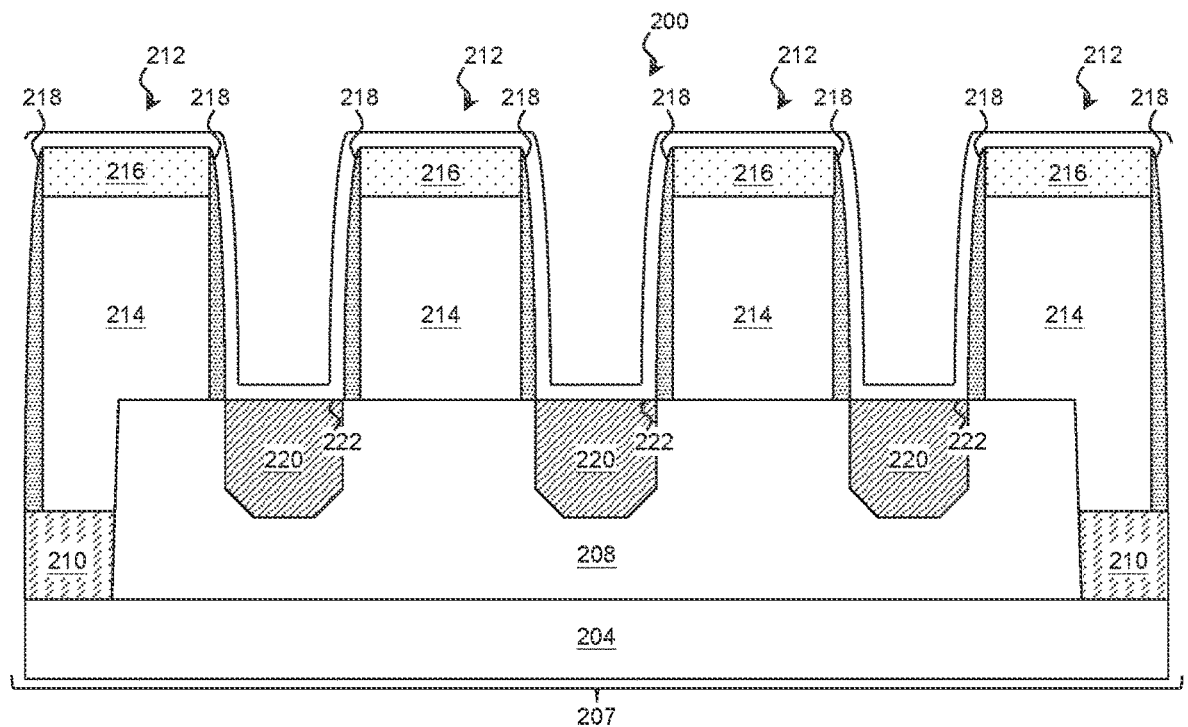

Referring to FIGS. 6A and 6B, the chamfering features 402 are removed from between the placeholder gates 212. The chamfering features 402 may be removed using any suitable etching process such as wet etching, dry etching, RIE, and/or other suitable etching processes, and the particular etching process and etchant chemistry may be selected to avoid significant etching of the liner 302, the CESL 222, and/or other components of the workpiece 200. In some such examples, the chamfering features 402 are removed by ashing with an oxygen reactant.

Figure 7A:
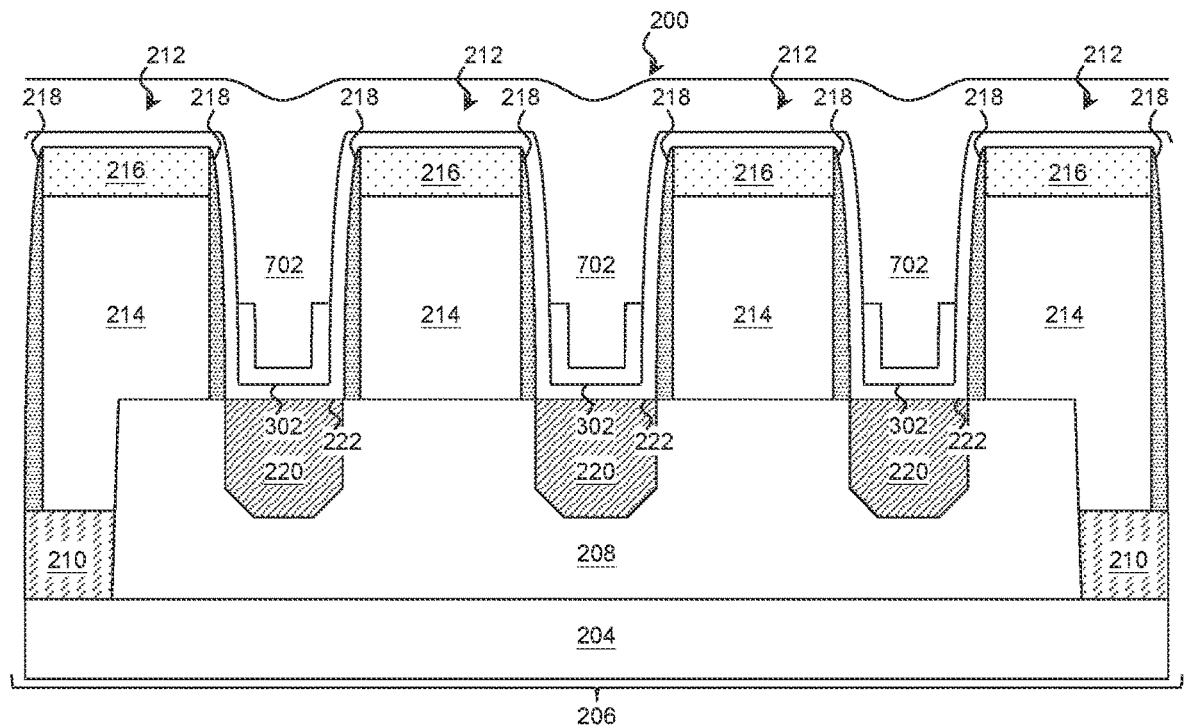
Figure 7B:
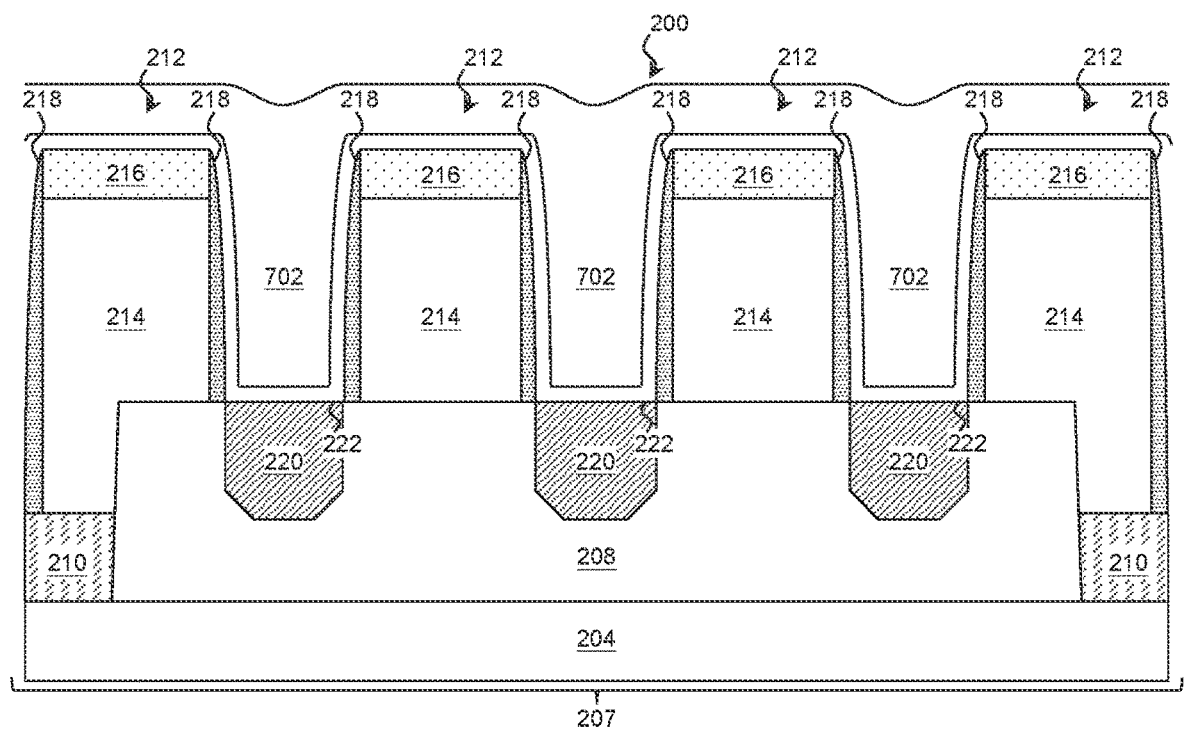

Referring to block 108 of FIG. 1 and to FIGS. 7A and 7B, an Inter-Level Dielectric (ILD) layer 702 is formed on the workpiece 200. The ILD layer 702 acts as an insulator that supports and isolates conductive traces of an electrical multi-level interconnect structure. In turn, the multi-level interconnect structure electrically interconnects elements of the workpiece 200, such as the source/drain features 220 and the functional gates formed later. The ILD layer 702 may include a dielectric material (e.g., a semiconductor oxide, a semiconductor nitride, a semiconductor oxynitride, a semiconductor carbide, etc.), SOG, fluoride-doped silicate glass (FSG), phosphosilicate glass (PSG), borophosphosilicate glass (BPSG), Black Diamond® (Applied Materials of Santa Clara, Calif.), Xerogel, Aerogel, amorphous fluorinated carbon, parylene, BCB, SILK® (Dow Chemical of Midland, Mich.), and/or combinations thereof. The ILD layer 702 may be formed by any suitable process including CVD, PVD, spin-on deposition, and/or other suitable processes.

Figure 8A:
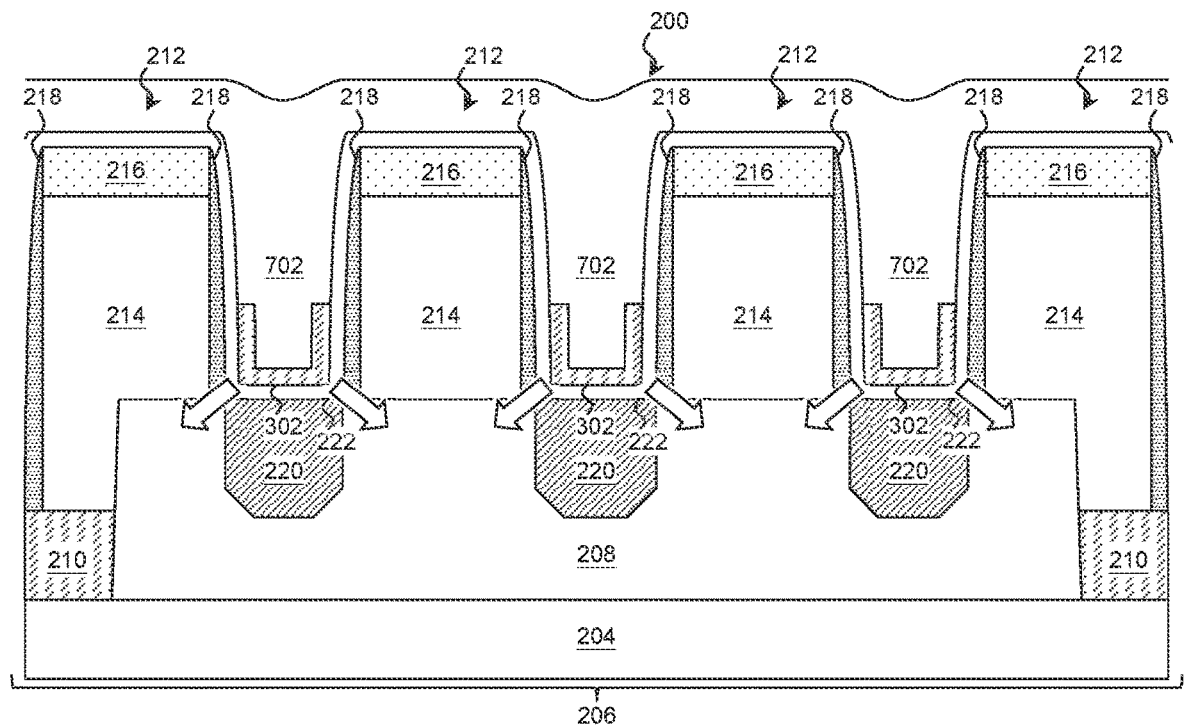
Figure 8B:
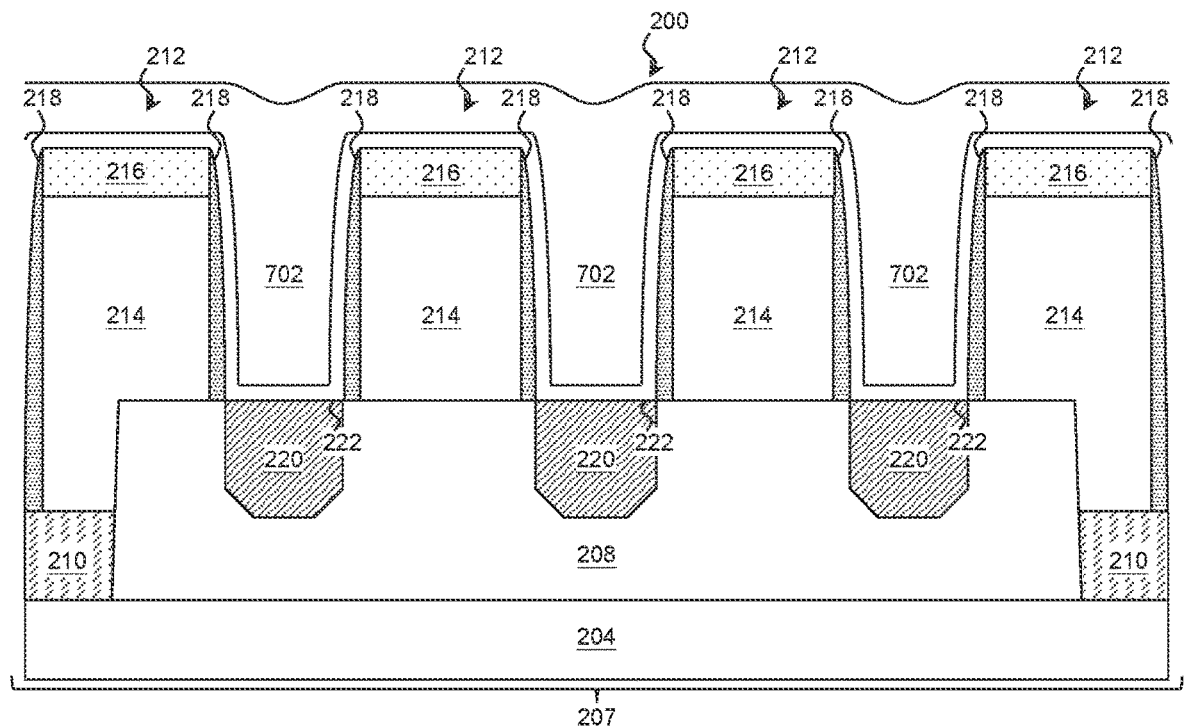

Referring to block 110 of FIG. 1 and to FIGS. 8A and 8B, an annealing process is performed on the workpiece 200.

The annealing process may be part of a curing or a densification process for the ILD layer 702. For example, the ILD layer 702 may be applied in a liquid form and the annealing may solidify any remaining liquid precursor. In a further example, the ILD layer 702 is deposited using a flowable CVD process and the as-deposited form includes elements (e.g., H, N, etc.) and/or bonds (e.g., Si—H, Si—N, etc.) that are not desirable in the finished ILD layer 702. The annealing may drive off undesired components and restructure the bonds to increase density, adjust the dielectric constant, and/or adjust any other suitable property of the ILD layer 702.

The annealing process may also cause oxygen in the as-deposited ILD layer 702 to migrate to the liner 302. The oxygen may bond with a semiconductor-containing liner 302 (e.g., a doped or undoped Si liner) to form a dielectric-containing liner 302 (e.g., a doped or undoped $SiO_x$ liner). Since the structure of silicon oxide has a larger volume than crystalline silicon, oxidation may cause the volume of the liner 302 to expand. However, the expansion may be limited by the ILD layer 702, thereby causing pressure to accumulate. In turn, this pressure may create the desired channel strain in the resulting devices.

As explained above, compressive strain on the channel region typically improves the carrier mobility of p-channel devices, while tensile strain improves the carrier mobility of n-channel devices. Accordingly, in some embodiments, the liner 302 is configured to improve the carrier mobility of the p-channel devices and is correspondingly disposed on the first region 206 for forming p-channel devices without being disposed on a second region 207 for forming n-channel devices.

The annealing process may include heating the workpiece 200 to any suitable temperature and, in various examples, includes heating the workpiece 200 to a temperature between about 300° C. and about 1000° C. for between about 10 minutes and about 24 hours. The annealing process oxidize some or all of the liner 302, and in some examples, the annealing is configured to proceed until substantially all of the liner 302 is converted to silicon oxide. Accordingly, the duration of the annealing may depend, in part on the thickness of the liner 302. After annealing, the liner 302 and ILD layer 702 may have some materials in common (e.g., semiconductors, oxygen, etc.), although the ratios of these materials and other material properties (e.g., density) may differ. For example, the ratio of oxygen to silicon in the liner 302 may be lower than the ratio in the ILD layer 702. Likewise, the density of the liner 302 may be higher than that of the ILD layer 702.

As noted above, because the liner 302 is limited to the bottom of the placeholder gates 212 and the sidewall spacers 218, the liner 302 may exert less pressure on the sidewall spacers 218—particularly near the top of the gate structures—during a gate replacement process. This may reduce fill issues, avoid unintended gate narrowing, decrease gate resistance, and/or avoid issues with contact alignment.

Figure 9A:
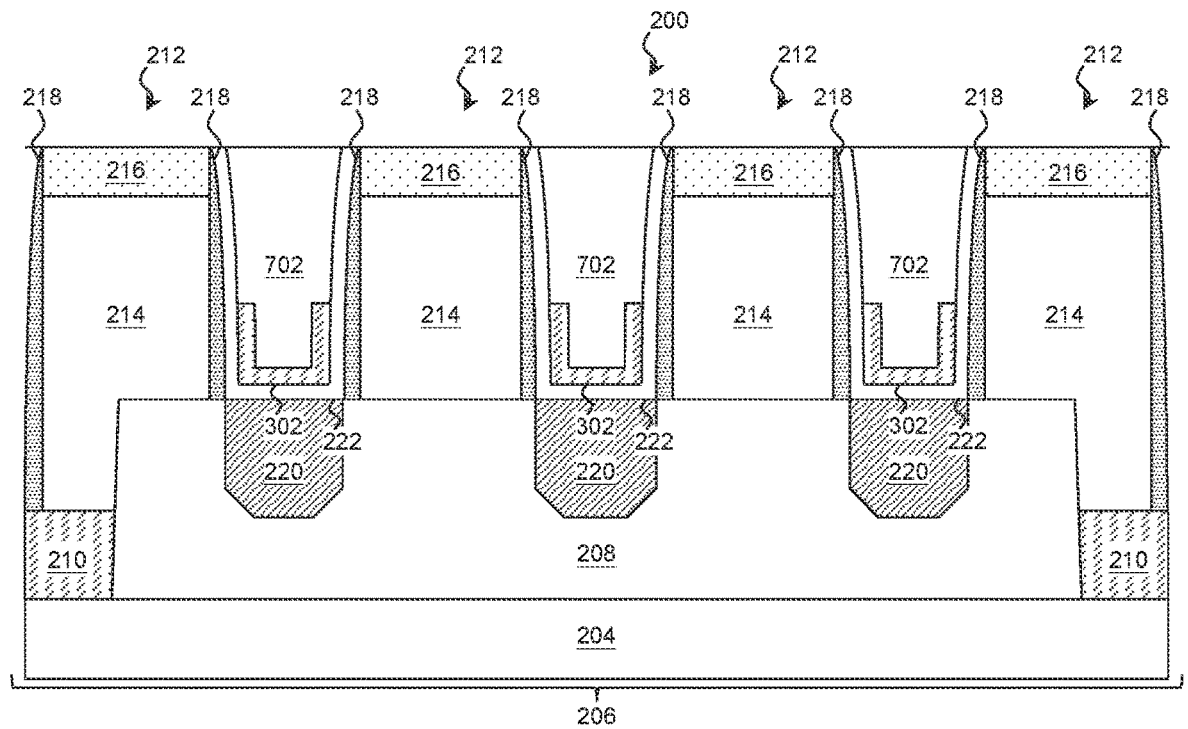
Figure 9B:
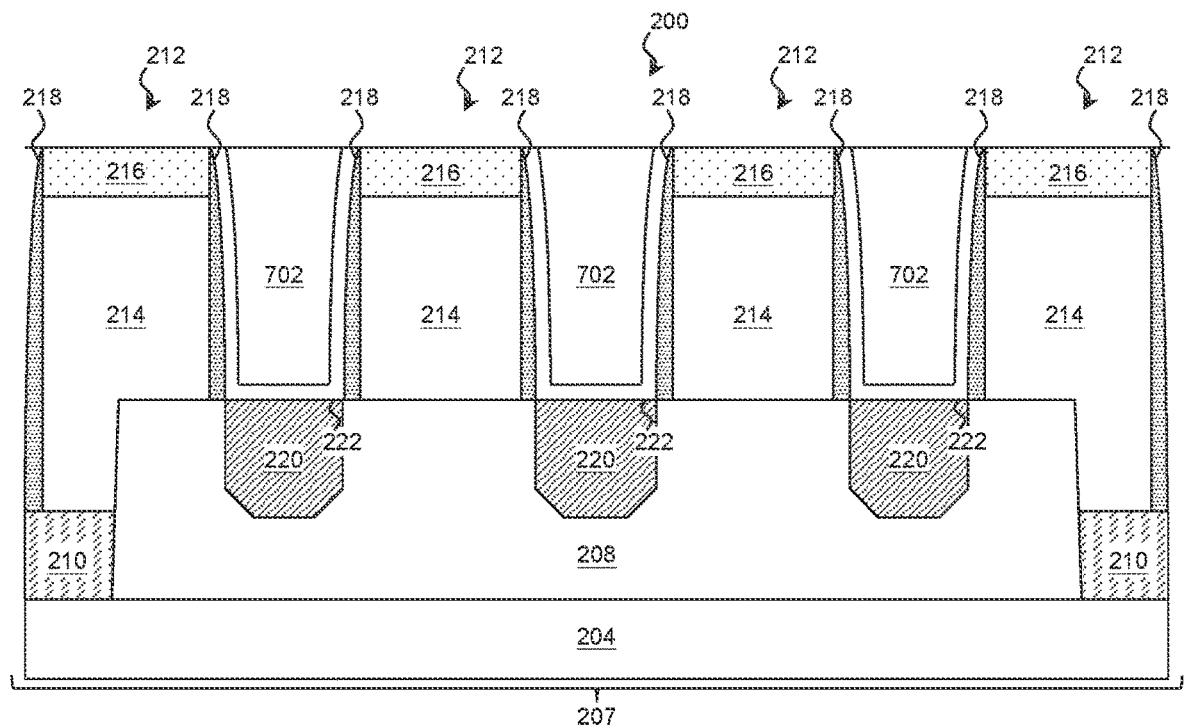

Referring to block 112 of FIG. 1 and to FIGS. 9A and 9B, a chemical mechanical polish/planarization (CMP) process is performed on the workpiece 200 to remove the ILD layer 702 and/or the CESL 222 from the top of the placeholder gates 212. The CMP process may be followed by an etch back process to remove any remaining ILD layer 702 material or CESL 222 material from the placeholder gates 212.

Figure 10A:
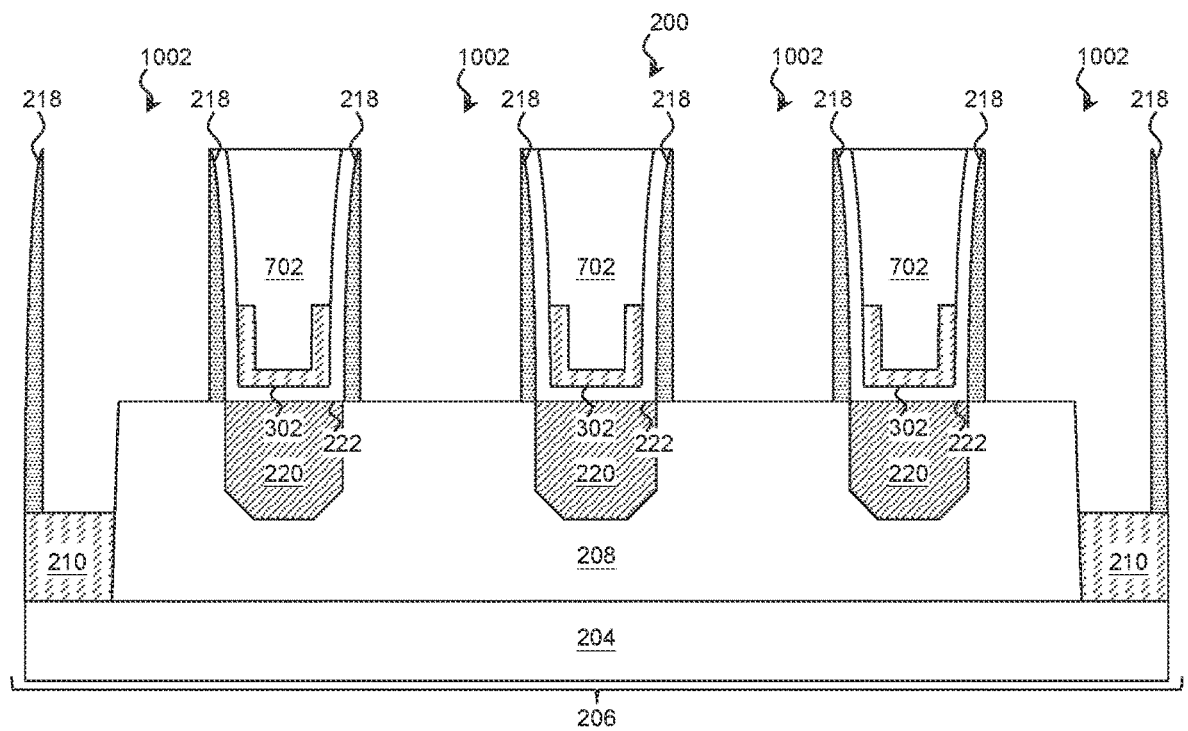
Figure 10B:
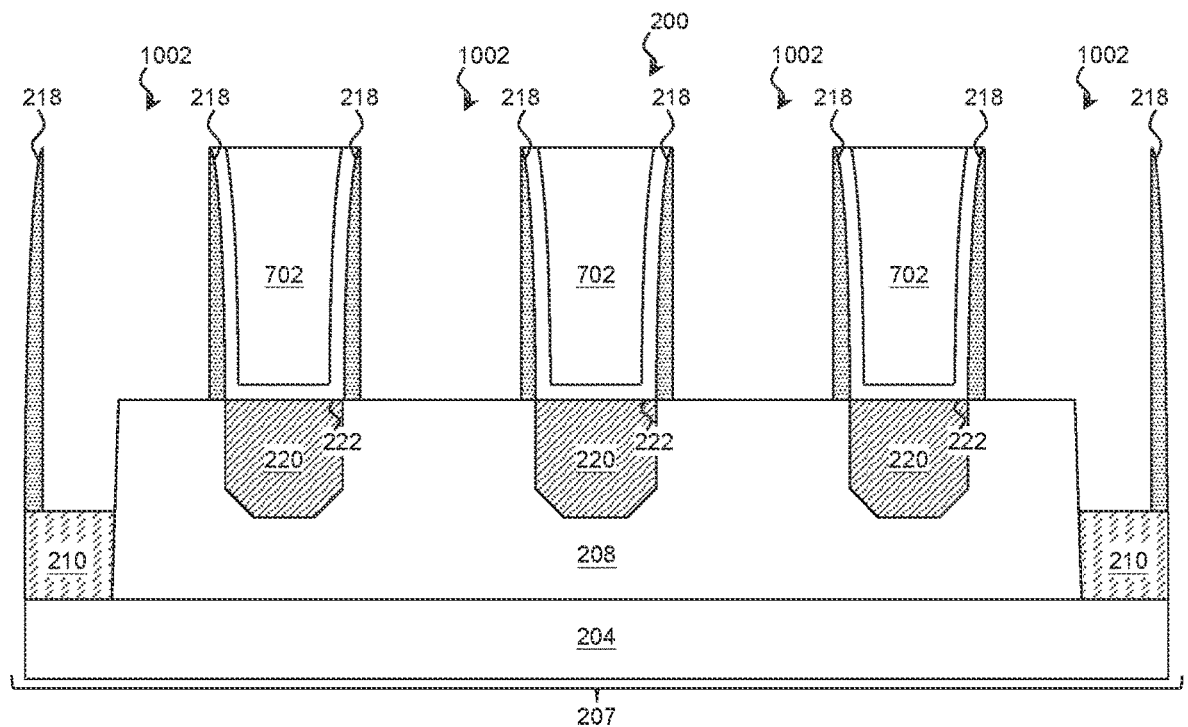

Referring to block 114 of FIG. 1 and to FIGS. 10A and 10B, the placeholder gates 212 are removed as part of a gate replacement process to provide recesses 1002 between the sidewall spacers 218. In some examples, the hard mask layer 216 is removed first by CMP and/or etching to expose the placeholder gate material 214. The placeholder gate material 214 may then be removed by one or more etching processes (e.g., wet etching, dry etching, RIE) using an etchant chemistry configured to selectively etch the placeholder gate material 214 and any remaining hard mask layer 216 without significant etching of the surrounding materials—such as the fins 208, the sidewall spacers 218, the CESL 222, the ILD layer 702, etc.

Figure 11A:
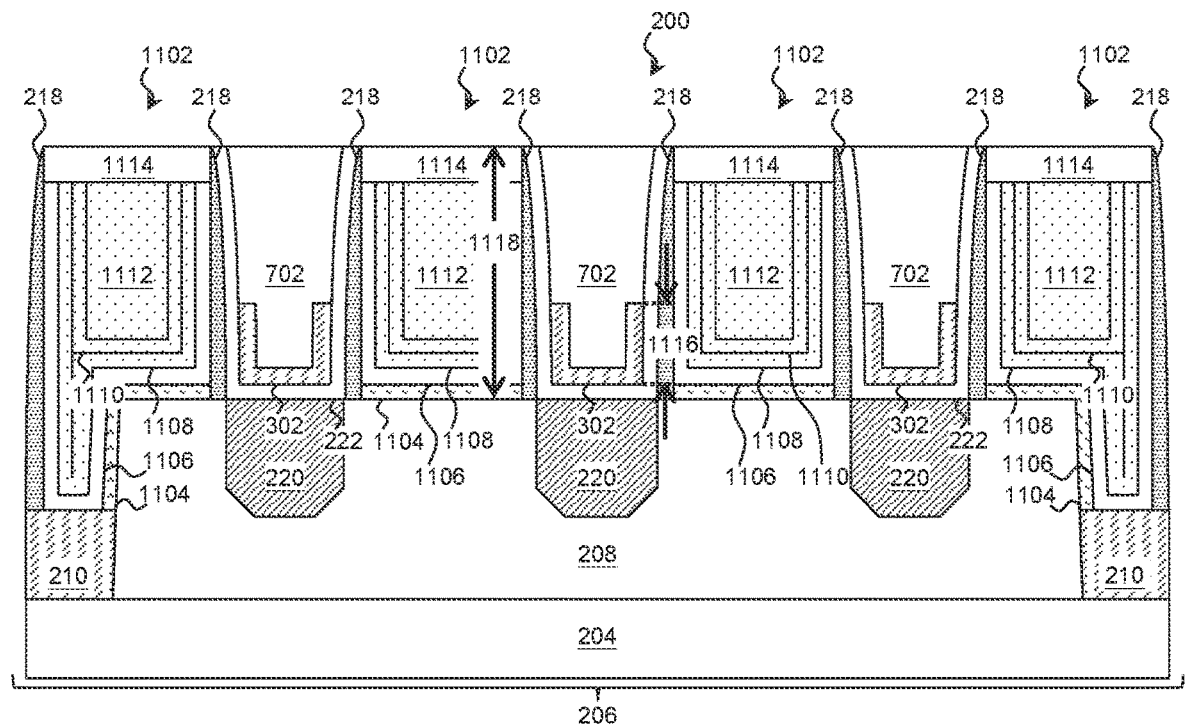
Figure 11B:
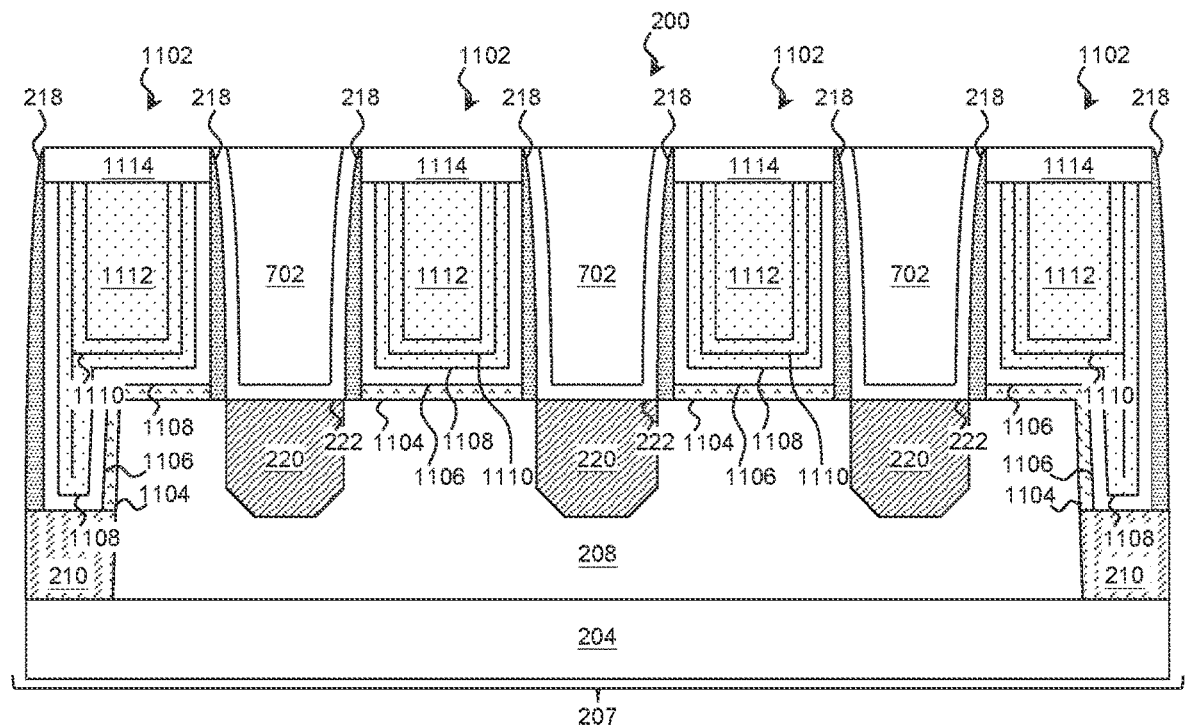

Referring to block 116 of FIG. 1 and to FIGS. 11A and 11B, functional gates 1102 are formed in the recesses 1002 defined by removing the placeholder gates 212. In some examples, forming a functional gate includes forming an interfacial layer 1104 on the top and side surfaces of the fins 208 at the channel regions. The interfacial layer 1104 may include an interfacial material, such as a semiconductor oxide, semiconductor nitride, semiconductor oxynitride, other semiconductor dielectrics, other suitable interfacial materials, and/or combinations thereof. The interfacial layer 1104 may be formed to any suitable thickness using any suitable process including thermal growth, ALD, CVD, HDP-CVD, PVD, spin-on deposition, and/or other suitable deposition processes. In some examples, the interfacial layer 1104 is formed by a thermal oxidation process and includes a thermal oxide of a semiconductor present in the fins 208 (e.g., silicon oxide for silicon-containing fins 208, silicon-germanium oxide for silicon-germanium-containing fins 208, etc.).

In some examples, forming the functional gate 1102 includes forming a gate dielectric 1106 disposed on the interfacial layer 1104. The gate dielectric 1106 may also be disposed along the vertical surfaces of the sidewall spacers 218. The gate dielectric 1106 may include one or more dielectric materials, which are commonly characterized by their dielectric constant relative to silicon dioxide. In some embodiments, the gate dielectric 1106 includes a high-k dielectric material, such as $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. Additionally or in the alternative, the gate dielectric 1106 may include other dielectrics, such as a semiconductor oxide, semiconductor nitride, semiconductor oxynitride, semiconductor carbide, amorphous carbon, TEOS, other suitable dielectric material, and/or combinations thereof. The gate dielectric 1106 may be formed using any suitable process including ALD, Plasma Enhanced ALD (PEALD), CVD, Plasma Enhanced CVD (PE CVD), HDP-CVD, PVD, spin-on deposition, and/or other suitable deposition processes. The gate dielectric 1106 may be formed to any suitable thickness, and in some examples, the gate dielectric 1106 has a thickness of between about 0.1 nm and about 3 nm.

In some examples, forming the functional gates 1102 includes forming gate electrodes on the workpiece 200. The gate electrodes may include a number of different conductive layers, of which three exemplary layers (a capping layer 1108, work function layer(s) 1110, and an electrode fill 1112) are shown. With respect to the first layer, in some examples, forming a gate electrode includes forming a capping layer 1108 on the workpiece 200. The capping layer 1108 may include any suitable conductive material including metals (e.g., W, Al, Ta, Ti, Ni, Cu, Co, etc.), metal nitrides, and/or metal silicon nitrides, and may be deposited via CVD, ALD, PE CVD, PEALD, PVD, and/or other suitable deposition processes. In various embodiments, the capping layer 1108 includes TaSiN, TaN, and/or TiN.

In some examples, forming a gate electrode includes forming one or more work function layers 1110 on the capping layer 1108. Suitable work function layer 1110 materials include n-type and/or p-type work function materials based on the type of device. Exemplary p-type work function metals include TiN, TaN, Ru, Mo, Al, WN, $ZrSi_2$, $MoSi_2$, $TaSi_2$, $NiSi_2$, WN, other suitable p-type work function materials, and/or combinations thereof. Exemplary n-type work function metals include Ti, Ag, TaAl, TaAlC, TiAlN, TaC, TaCN, TaSiN, Mn, Zr, other suitable n-type work function materials, and/or combinations thereof. The work function layer(s) 1110 may be deposited by any suitable technique including ALD, CVD, PE CVD, PEALD, PVD, and/or combinations thereof. Because the p-channel and n-channel devices may have different work function layers 1110, in some examples, the p-type work function layers 1110 are deposited in a first deposition process that uses a dielectric hard mask to prevent depositing on the electrodes of the n-channel devices, and the n-type work function layers 1110 are deposited in a second deposition process that uses a dielectric hard mask to prevent depositing on the electrodes of the p-channel devices.

In some examples, forming a gate electrode includes forming an electrode fill 1112 on the work function layer(s) 1110. The electrode fill 1112 may include any suitable material including metals (e.g., W, Al, Ta, Ti, Ni, Cu, Co, etc.), metal oxides, metal nitrides and/or combinations thereof, and in an example, the electrode fill includes tungsten. The electrode fill 1112 may be deposited by any suitable technique including ALD, CVD, PE CVD, PEALD, PVD, and/or combinations thereof.

A CMP process may be performed to remove excess electrode material (e.g., material of: the capping layer 1108, the work function layer(s) 1110, the electrode fill 1112, etc.) that is outside of the functional gates 1102.

In some examples, forming the gate structures 1102 includes partially recessing the gate structures 1102 (e.g., the gate dielectric 1106, the capping layer 1108, the work function layer(s) 1110, the electrode fill 1112, etc.) and forming a gate cap 1114 on the recessed gate structures 1102. The gate cap 1114 may include any suitable material, such as: a dielectric material (e.g., a semiconductor oxide, a semiconductor nitride, a semiconductor oxynitride, a semiconductor carbide, a semiconductor oxycarbonitride, etc.), polysilicon, SOG, TEOS, PE-oxide, HARP-formed oxide, and/or other suitable material. In some examples, the gate cap 1114 includes silicon oxycarbonitride. The gate cap 1114 may be formed to any suitable thickness using any suitable deposition technique (e.g., CVD, HDP-CVD, ALD, etc.). In some examples, the gate cap 1114 has a thickness between about 1 nm and about 50 nm and is deposited by a CVD and/or ALD process.

Thus, the method 100 provides a liner 302 with reduced height along the sides of the functional gate 1102. In various examples, the height 1116 of the vertical portions of the liner 302 is between about 1 nm and about 50 nm and is about 1/100 to about 4/5 the height 1118 of the functional gate 1102.

Referring to block 118 of FIG. 1, the workpiece 200 is provided for further fabrication. In various examples, this includes forming contacts coupling to the source/drain features 220 and to the functional gates 1102, forming a remainder of an electrical interconnect structure, dicing, packaging, and other fabrication processes.

Figure 12A:
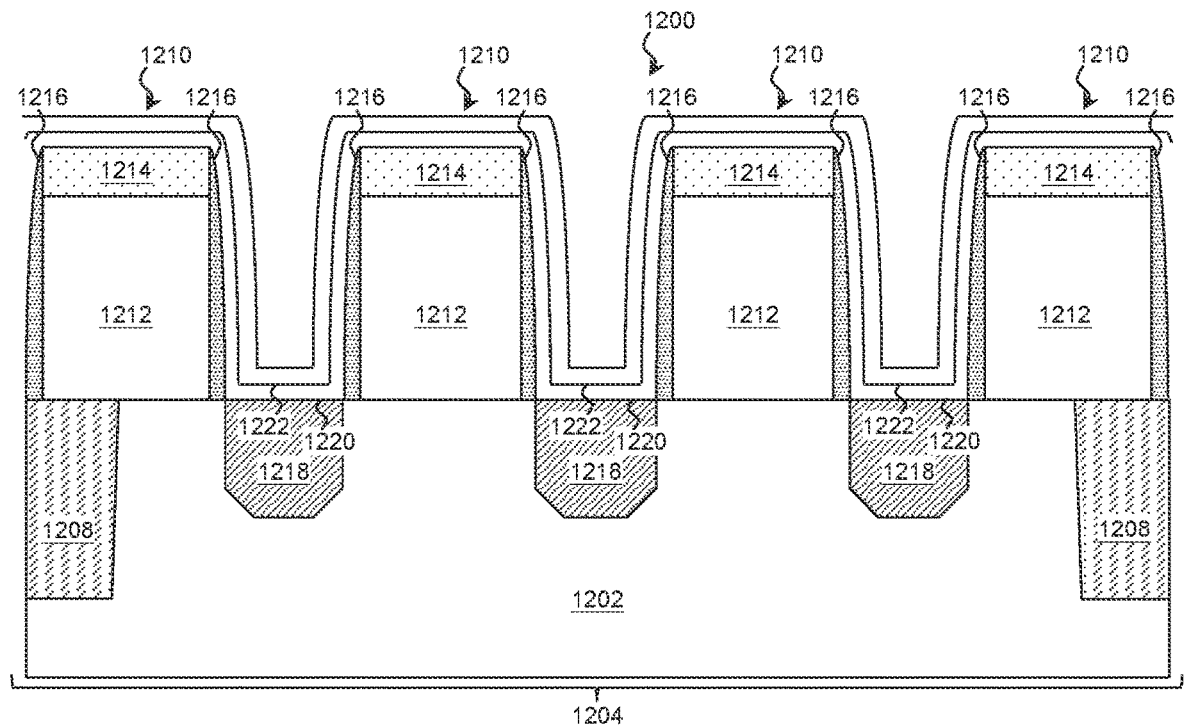
FIGS. 12A, 13A, and 14A are cross-sectional diagrams of a first region of a workpiece for forming planar devices at various points in the method of fabrication according to various aspects of the present disclosure.
Figure 12B:
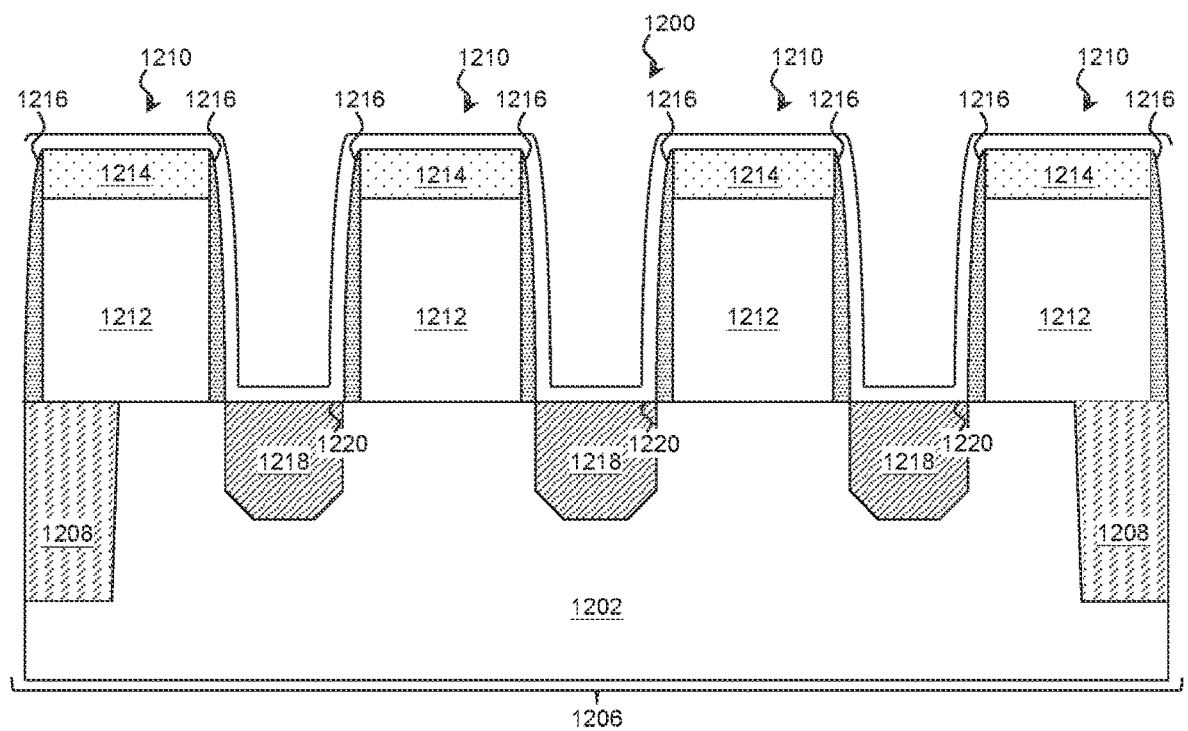
FIGS. 12B, 13B, and 14B are cross-sectional diagrams of a second region of the workpiece for forming planar devices at various points in the method of fabrication according to various aspects of the present disclosure.
Figure 13A:
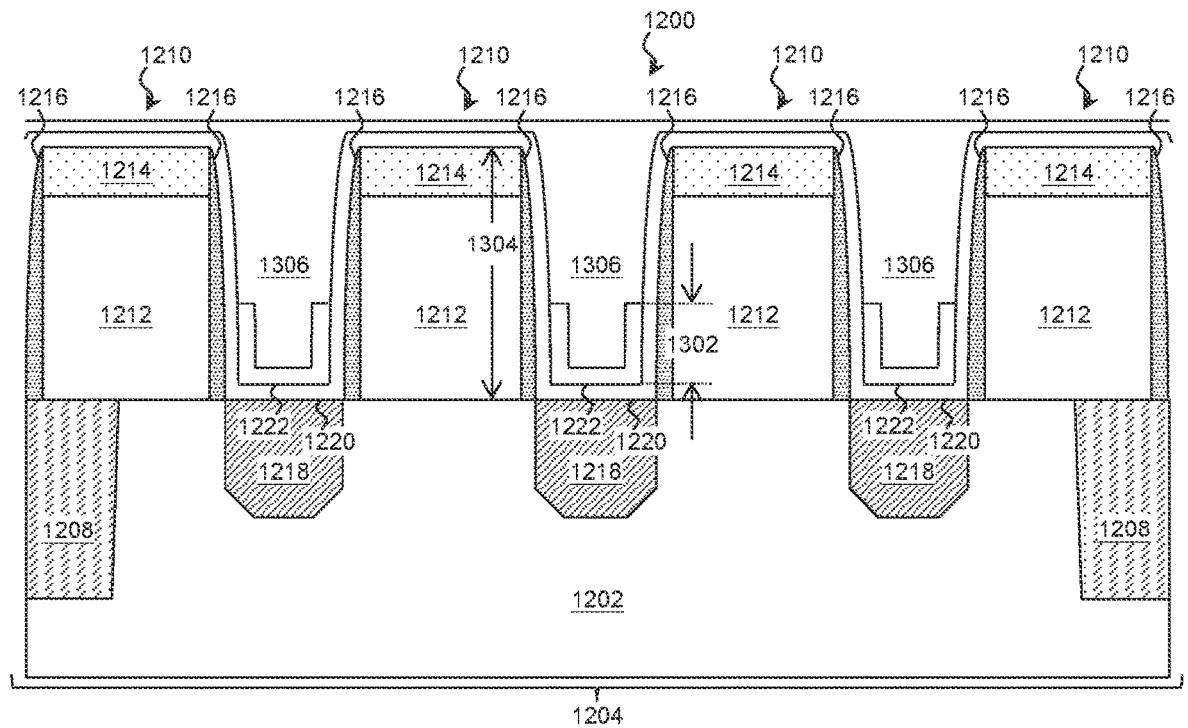
Figure 13B:
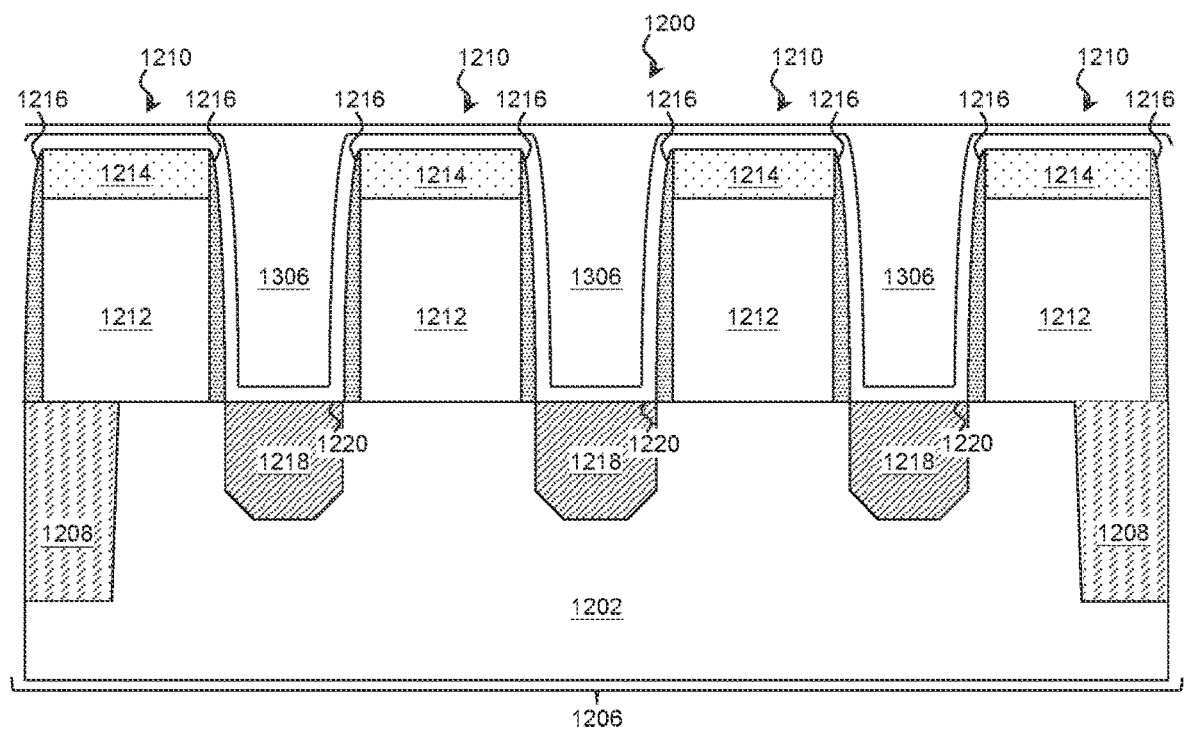
Figure 14A:
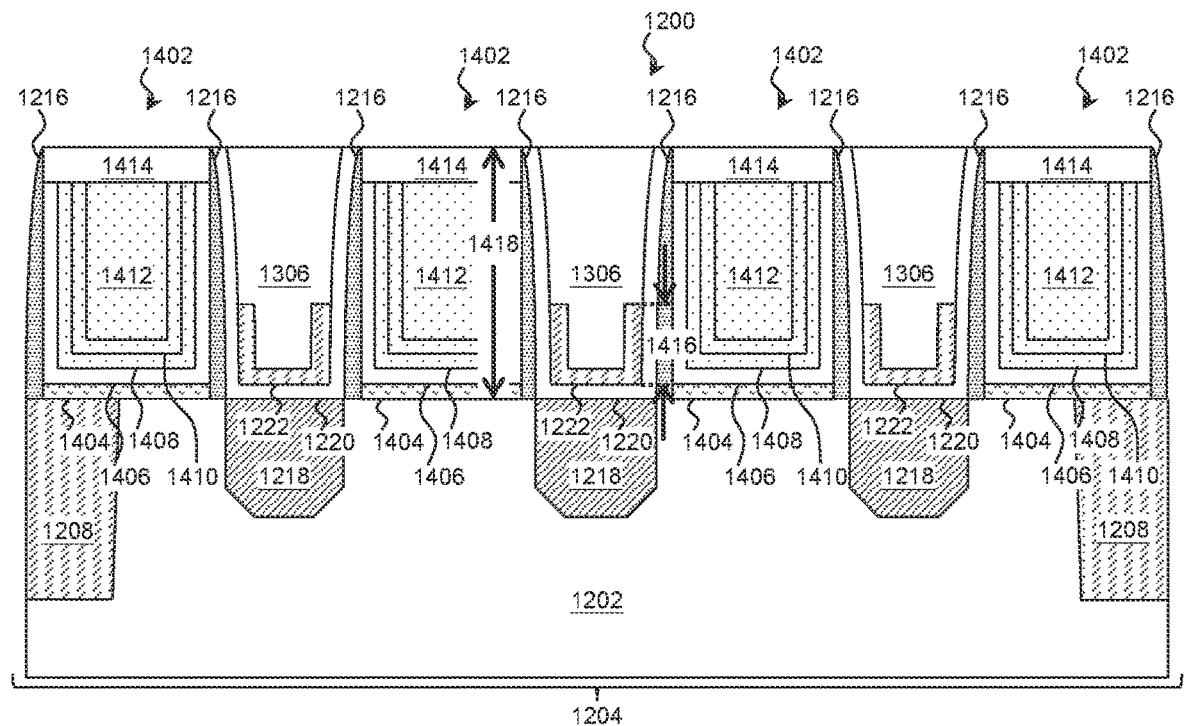
Figure 14B:
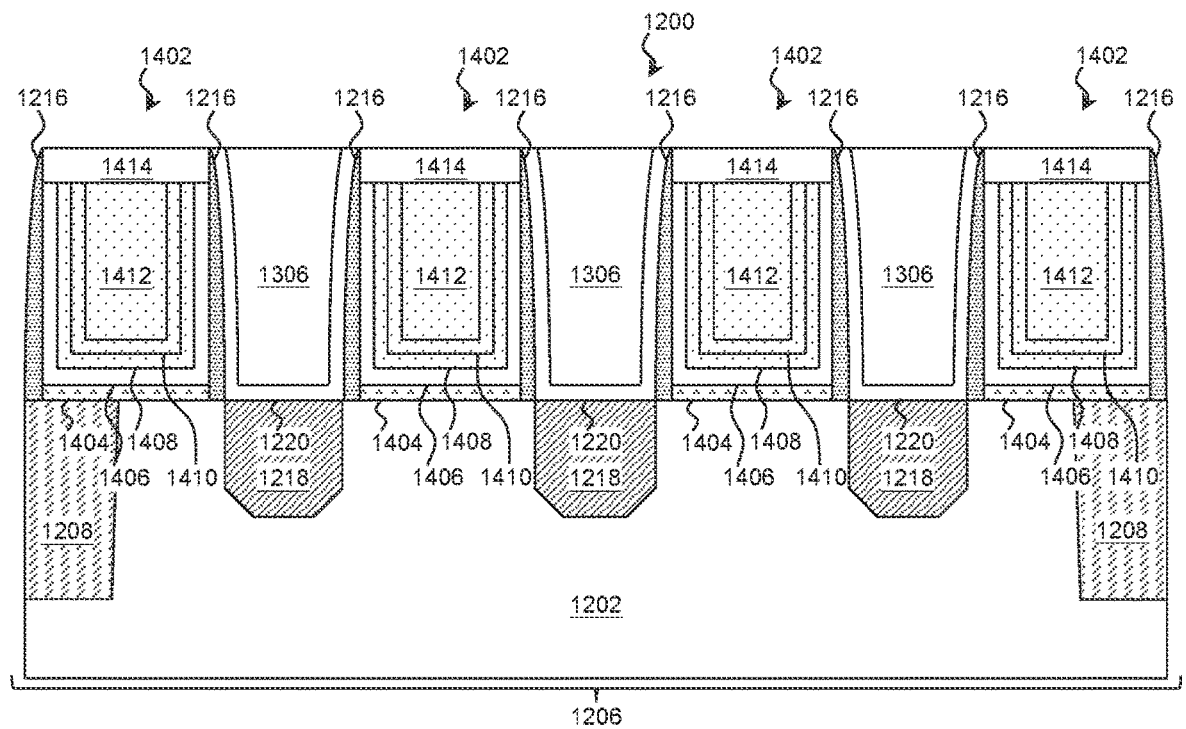

While the above examples refer to non-planar devices (e.g., FinFETs), the method 100 is equally suitable for forming a strain-generating liner in a planar device. Examples of using the method 100 to form a planar device are described with reference to FIG. 1 and to FIGS. 12A-14B. FIGS. 12A, 13A, and 14A are cross-sectional diagrams of a first region of a workpiece 1200 for forming planar devices at various points in the method of fabrication according to various aspects of the present disclosure. FIGS. 12B, 13B, and 14B are cross-sectional diagrams of a second region of the workpiece 1200 for forming planar devices at various points in the method of fabrication according to various aspects of the present disclosure. FIGS. 12A-14B have been simplified for the sake of clarity and to better illustrate the concepts of the present disclosure. Additional features may be incorporated into the workpiece 1200, and some of the features described below may be replaced or eliminated for other embodiments of the workpiece 1200.

Referring to block 102 of FIG. 1 and to FIGS. 12A and 12B, the workpiece 1200 is received. The workpiece 1200 includes a substrate 1202 that may be substantially similar to the substrate 204 above, except that it may not include device fins extending from it. Instead of forming devices on the fins, planar devices (e.g., field-effect transistors) are formed on the top surface of the substrate 1202. In an example, the substrate 1202 includes a first region 1204 for forming p-channel devices illustrated in FIG. 12A and a second region 1206 for forming n-channel devices illustrated in FIG. 12B.

Active regions of the substrate 1202 may be physically and electrically separated from each other by isolation features 1208—such as STIs—substantially as described above.

The workpiece 1200 may include placeholder gates 1210 disposed on the substrate 1202. The placeholder gates 1210 may be substantially similar to those described above except that they may be disposed on the top surface of the substrate 1202 rather than wrapping around a fin. The placeholder gates 1210 may include a layer of placeholder gate material 1212, a hard mask layer 1214, and sidewall spacers 1216, each substantially as described above.

The workpiece 1200 may also include source/drain features 1218 disposed on the substrate 1202 on opposing sides of the placeholder gates 1210 and a contact-etch stop layer (CESL) 1220 disposed on the sidewall spacers 1216 and on the source/drain features 1218, each substantially similar to those described above.

Referring to block 104 of FIG. 1, a liner 1222 is formed on the CESL 1220 so that the liner 1222 is disposed over the source/drain features 1218 and the placeholder gates 1210 and extends vertically alongside the placeholder gates 1210. This may be performed substantially as described above. The liner 1222 may be thick enough to create channel stress when the liner is oxidized while being thin enough to oxidize fully within a given annealing budget. In some examples, the liner 1222 has a thickness between about 1 nm and about 10 nm.

Referring to block 106 of FIG. 1 and to FIGS. 13A and 13B, a top portion of the liner 1222 is removed from along the side surfaces of the placeholder gates 1210 while a bottom portion of the liner 1222 remains along the side surfaces of the placeholder gates 1210 and on the source/drain features 1218. This may be performed substantially as described above, and in some such examples, chamfering features are formed that protect underlying portions of the liner 1222 while exposed portions of the liner 1222 are removed. The remaining portion of the liner extending along the vertical surfaces of the CESL 1220 may have any suitable height 1302. In various examples, height 1302 is between about 1 nm and about 50 nm and is about 1/100 to about 4/5 the height 1304 of the placeholder gate 1210.

Accordingly, the majority of the placeholder gates 1210 (and accordingly, the majority of the sidewall spacers 1216 and of the vertical surfaces of the CESL 1220) may be free of the liner 1222.

Referring to block 108 of FIG. 1 and to FIGS. 13A and 13B, an Inter-Level Dielectric (ILD) layer 1306 substantially similar to that described above is formed on the workpiece 1200.

Referring to block 110 of FIG. 1, an annealing process is performed on the workpiece 1200. The annealing process may be part of a curing or a densification process for the ILD layer 1306 and may also cause oxygen in the as-deposited ILD layer 1306 to migrate to the liner 1222. The oxygen may bond with a semiconductor-containing liner 1222 (e.g., a doped or undoped Si liner) to form a dielectric-containing liner 1222 (e.g., a doped or undoped $SiO_x$ liner). Since the structure of silicon oxide has a larger volume than crystalline silicon, oxidation may cause the volume of the liner 1222 to expand. However, the expansion may be limited by the ILD layer 1306, thereby causing pressure to accumulate. In turn, this pressure may create the desired channel strain in the resulting devices.

In some embodiments, the liner 1222 is configured to improve the carrier mobility of the p-channel devices and is correspondingly disposed on the first region 1204 for forming p-channel devices without being disposed on a second region 1206 for forming n-channel devices.

The annealing process may include heating the workpiece 1200 to any suitable temperature and, in various examples, includes heating the workpiece 1200 to a temperature between about 300° C. and about 1000° C. for between about 10 minutes and about 24 hours. After annealing, the liner 1222 and ILD layer 1306 may have some materials in common (e.g., semiconductors, oxygen, etc.), although the ratios of these materials and other material properties (e.g., density) may differ. For example, the ratio of oxygen to silicon in the liner 1222 may be lower than the ratio in the ILD layer 1306. Likewise, the density of the liner 1222 may be higher than that of the ILD layer 1306.

As noted above, because the liner 1222 is limited to the bottom of the placeholder gates 1210 and sidewall spacers 1216, the liner 1222 may exert less pressure on the sidewall spacers 1216—particularly near the top of the gate structures—during a gate replacement process. This may reduce fill issues, avoid unintended gate narrowing, decrease gate resistance, and/or avoid issues with contact alignment.

Referring to block 112 of FIG. 1, a chemical mechanical polish/planarization (CMP) process is performed on the workpiece 1200 to remove the ILD layer 1306 and/or the CESL 1220 from the top of the placeholder gates 1210.

Referring to block 114 of FIG. 1, the placeholder gates 1210 are removed as part of a gate replacement process to provide recesses between the sidewall spacers 1216.

Referring to block 116 of FIG. 1 and to FIGS. 14A and 14B, functional gates 1402 are formed in the recesses defined by removing the placeholder gates 1210. Forming the functional gates 1402 may include forming an interfacial layer 1404, a gate dielectric 1406, a capping layer 1408, work function layer(s) 1410, an electrode fill 1412, and/or a gate cap 1414, each substantially as described above.

Referring to block 118 of FIG. 1, the workpiece 1200 is provided for further fabrication. In various examples, this includes forming contacts coupling to the source/drain features 1218 and the functional gates 1402, forming a remainder of an electrical interconnect structure, dicing, packaging, and other fabrication processes.

Thus, the method 100 provides a liner 1222 with reduced height along the sides of the functional gate 1402. In various examples, the height 1416 of the vertical portions of the liner 1222 is between about 1 nm and about 50 nm and is about $\frac{1}{100}$ to about $\frac{4}{5}$ the height 1418 of the functional gate 1402.

Thus, the present disclosure provides examples of an integrated circuit with a strain-generating liner and a method for forming the integrated circuit. In some embodiments, an integrated circuit device includes a substrate, a fin extending from the substrate, and a gate disposed on the fin and having a bottom portion disposed towards the fin and a top portion disposed on the bottom portion. A liner is disposed on a side surface of the bottom portion of the gate such that the top portion of the gate is free of the liner. In some such embodiments, the liner is configured to produce a channel strain. In some such embodiments, the liner has a height that is between about $\frac{1}{100}$ and about $\frac{4}{5}$ of a height of the gate. In some such embodiments, a majority of the gate is free of the liner. In some such embodiments, the substrate includes a first region with a first device having a first channel type and a second region with a second device having a second channel type. The first region includes the liner, and the second region is free of the liner. In some such embodiments, the fin includes a source/drain feature and the liner is disposed on the source/drain feature. In some such embodiments, the integrated circuit device further includes an etch stop layer disposed between the liner and the side surface of the bottom portion of the gate. In some such embodiments, the etch stop layer is further disposed between the liner and the fin. In some such embodiments, the device also includes an inter-level dielectric layer disposed on the liner. The liner physically contacts a bottom portion of the etch stop layer, and the inter-level dielectric layer physically contacts a top portion of the etch stop layer. In some such embodiments, the liner and the inter-level dielectric layer each include a semiconductor and oxygen. In some such embodiments, a ratio of the semiconductor to oxygen in the liner is different from a ratio of the semiconductor to oxygen in the inter-level dielectric layer. In some such embodiments, a density of the liner is different from a density of the inter-level dielectric layer. In some such embodiments, the liner includes a central portion and a side portion disposed towards the gate that extends above the central portion. In some such embodiments, the side portion extends to a height that is less than a height of the gate.

In further embodiments, a device includes a substrate, a pair of source/drain features disposed on the substrate, a gate disposed between the pair of source/drain features, and a liner disposed on each of the pair of source/drain features and extending alongside a first portion of the gate such that a second portion of the gate is free of the liner. In some such embodiments, the liner includes a horizontal portion extending along a first of the pair of source/drain features and having a first height, a vertical portion extending alongside the gate and having a second height that is greater than the first height. In some such embodiments, the second height is between about $\frac{1}{100}$ and about $\frac{4}{5}$ of a height of the gate. In some such embodiments, the liner is configured to produce a channel strain. In some such embodiments, a majority of the gate is free of the liner. In some such embodiments, the device further includes a contact etch stop layer disposed on each of the pair of source/drain features between the liner and the respective source/drain feature of the pair of source/drain features. In some such embodiments, the contact etch stop layer is further disposed between the liner and the gate.

In yet further embodiments, a method includes receiving a substrate having a placeholder gate disposed thereupon, and forming a liner extending along a first portion of a side surface of the placeholder gate such that a second portion of the side surface is free of the liner. The liner is configured to produce a channel strain. The placeholder gate is replaced with a functional gate. In some such embodiments, the forming of the liner includes: forming the liner on the first portion and the second portion of the side surface of the placeholder gate, and performing a chamfering process to remove the liner from the second portion of the side surface of the placeholder gate. In some such embodiments, the forming of the liner includes: depositing an inter-level dielectric layer on the liner, and annealing the substrate to oxidize the liner. In some such embodiments, the annealing is configured such that oxygen migrates from the inter-level dielectric layer to the liner. In some such embodiments, the forming of the liner is configured such that a majority of the side surface of the placeholder gate is free of the liner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a fin structure over a substrate;
    forming a first gate stack over the fin structure;
    forming a source/drain feature in the fin structure;
    forming an etch stop layer on the first gate stack and the source/drain feature;
    forming a semiconductor liner layer on the etch stop layer disposed on the first gate stack and the source/drain feature, wherein after forming the semiconductor liner layer on the etch stop layer the semiconductor liner layer is prevented from interfacing with the source/drain feature by the etch stop layer;
    removing a first portion of the semiconductor liner layer from over the first gate stack such that a second portion of the semiconductor liner layer extends along a bottom portion of the first gate stack without extending to a top portion of the first gate stack after the removing of the first portion of the semiconductor liner layer; and
    oxidizing the second portion of the semiconductor liner layer to form an oxidized liner layer disposed on the bottom portion of the first gate stack.

2. The method of claim 1, further comprising forming an interlayer dielectric layer over the second portion of the semiconductor liner layer after the removing of the first portion of the semiconductor liner layer from over the first gate stack.

3. The method of claim 1, further comprising:
    removing a portion of the first gate stack to form a trench; and
    forming a gate electrode layer within the trench.

4. The method of claim 3, wherein a portion of the fin structure is exposed within the trench after the removing of the portion of the first gate stack to form the trench.

5. The method of claim 1, wherein the second portion of the semiconductor liner layer occupies a first volume of space and the oxidized liner layer occupies a second volume space that is greater than the first volume.

6. The method of claim 1, wherein the oxidizing of the second portion of the semiconductor liner layer to form the oxidized liner layer include performing an annealing process at temperature between about 300° C. and 1000° C.

7. The method of claim 1, further comprising forming a sacrificial layer directly on the semiconductor liner layer disposed over the source/drain feature, and wherein the sacrificial layer is disposed on the second portion of the semiconductor liner layer during the removing a first portion of the semiconductor liner layer from over the first gate stack.

8. The method of claim 7, further comprising removing the sacrificial disposed on the second portion of the semiconductor liner layer.

9. A method comprising:
    forming a first gate stack and a second gate stack over a substrate;
    forming a source/drain feature in the substrate between the first gate stack and the second gate stack;
    forming an etch stop layer over the first gate stack, the second gate stack and the source/drain feature;
    forming a liner layer directly on the etch stop layer disposed over the first gate stack, the second gate stack and the source/drain feature, wherein the liner layer is prevented from interfacing with the source/drain feature by the etch stop layer after the forming of the liner layer directly on the etch stop layer disposed over the first gate stack, the second gate stack and the source/drain feature;
    removing a portion of the liner layer from over the first gate stack and the second gate stack thereby forming a u-shaped liner layer extending between the first gate stack and the second gate stack;
    forming an interlayer dielectric layer over the first gate stack, the second gate stack and the u-shaped liner layer; and
    treating the u-shaped liner layer such that the treated u-shape liner occupies more volume than the u-shaped liner layer.

10. The method of claim 9, wherein the treating of the u-shaped liner layer includes performing an oxidation process of the u-shaped liner layer.

11. The method of claim 9, further comprising:
    after treating the u-shaped liner layer, removing a portion of the first gate stack to form a trench; and
    forming a gate electrode layer within the trench to thereby form a second gate stack.

12. The method of claim 11, wherein the second gate stack is part of a p-type transistor.

13. The method of claim 9, wherein the substrate includes a semiconductor fin structure,
    wherein the forming of the first gate stack and the second gate stack over the substrate includes forming the first gate stack and the second gate stack over the semiconductor fin structure, and
    wherein the forming of the source/drain feature in the substrate between the first gate stack and the second gate stack includes forming the source/drain feature in the semiconductor fin structure between the first gate stack and the second gate stack.

14. The method of claim 9, wherein the treated u-shaped liner layer has a different material composition than the u-shaped liner layer.

15. The method of claim 9, wherein the liner layer is formed of a semiconductor material.

16. The method of claim 9, wherein forming the first gate stack and the second gate stack over the substrate includes forming a third gate stack,
  wherein forming the etch stop layer over the first gate stack, the second gate stack and the source/drain feature further includes forming the etch stop layer over the third gate stack, and
  wherein forming the liner layer directly on the etch stop layer disposed over the first gate stack, the second gate stack and the source/drain feature occurs without forming the liner layer over the third gate stack.

17. A method comprising:
  receiving a substrate having a placeholder gate disposed thereupon;
  forming an etch stop layer on the placeholder gate such that the etch stop layer is disposed on a top surface and a side surface of the of the placeholder gate, the top surface of the placeholder gate facing away from the substrate;
  forming a liner extending along a first portion of the side surface of the placeholder gate such that a second portion of the side surface is free of the liner, wherein the liner is configured to produce a channel strain, wherein the etch stop layer is disposed on the top surface and the side surface of the placeholder gate after the forming of the liner; and
  replacing the placeholder gate with a functional gate.

18. The method of claim 17, wherein the forming of the liner includes:
  forming the liner on the first portion and the second portion of the side surface of the placeholder gate; and
  performing a chamfering process to remove the liner from the second portion of the side surface of the placeholder gate.

19. The method of claim 17, wherein the forming of the liner includes:
  depositing an inter-level dielectric layer on the liner; and
  annealing the substrate to oxidize the liner.

20. The method of claim 17, wherein the forming of the liner is configured such that a majority of the side surface of the placeholder gate is free of the liner.

* * * * *